United States Patent
Chang et al.

(10) Patent No.: US 9,646,871 B2
(45) Date of Patent: May 9, 2017

(54) SEMICONDUCTOR STRUCTURE WITH SHALLOW TRENCH ISOLATION AND MANUFACTURING METHOD THEREOF

(71) Applicant: TAIWAN SEMICONDUCTOR MANUFACTURING COMPANY LTD., Hsinchu (TW)

(72) Inventors: Che-Cheng Chang, New Taipei (TW); Tung-Wen Cheng, New Taipei (TW); Jui Fu Hseih, Hsinchu County (TW); Mu-Tsang Lin, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/337,562

(22) Filed: Jul. 22, 2014

(65) Prior Publication Data

US 2016/0027684 A1    Jan. 28, 2016

(51) Int. Cl.
  *H01L 29/76* (2006.01)
  *H01L 21/762* (2006.01)
  *H01L 29/06* (2006.01)
  *H01L 29/78* (2006.01)

(52) U.S. Cl.
  CPC .. *H01L 21/76235* (2013.01); *H01L 21/76232* (2013.01); *H01L 29/0649* (2013.01); *H01L 29/785* (2013.01)

(58) Field of Classification Search
  CPC ........... H01L 29/0649; H01L 21/76224; H01L 21/76232; H01L 21/76235; H01L 29/785; H01L 21/823481; H01L 27/10826; H01L 27/10879; H01L 2924/1306; H01L 29/1079; H01L 29/945
  USPC .......................................... 257/510; 438/424
  See application file for complete search history.

(56) References Cited

U.S. PATENT DOCUMENTS

| | | | | |
|---|---|---|---|---|
| 6,232,202 B1 * | 5/2001 | Hong | ................ | H01L 21/76232 257/E21.549 |
| 6,313,008 B1 * | 11/2001 | Leung | ................ | H01L 21/76232 257/510 |
| 2005/0035427 A1 * | 2/2005 | Park et al. | ..................... | 257/510 |
| 2007/0059897 A1 * | 3/2007 | Tilke et al. | ................... | 438/424 |
| 2007/0102756 A1 * | 5/2007 | Lojek | ............................ | 257/327 |
| 2007/0231997 A1 * | 10/2007 | Doyle | ............... | H01L 29/66818 438/253 |
| 2008/0124866 A1 * | 5/2008 | Eun | ....................... | H01L 27/115 438/264 |
| 2008/0296702 A1 * | 12/2008 | Lee | ................ | H01L 21/823431 257/401 |
| 2012/0086053 A1 * | 4/2012 | Tseng | ................ | H01L 29/66795 257/288 |

(Continued)

*Primary Examiner* — Duy T Nguyen
(74) *Attorney, Agent, or Firm* — WPAT, P.C., Intellectual Property Attorneys; Anthony King

(57) ABSTRACT

A semiconductor structure includes a semiconductor substrate and a shallow trench isolation (STI). The STI includes a sidewall interfacing with the semiconductor substrate. The STI extrudes from a bottom portion of the semiconductor substrate, and the STI includes a bottom surface contacting the bottom portion of the semiconductor substrate; a top surface opposite to the bottom surface. The bottom surface includes a width greater than a width of the top surface.

13 Claims, 21 Drawing Sheets

(56) References Cited

U.S. PATENT DOCUMENTS

2012/0299099 A1* 11/2012 Huang .............. H01L 29/66795
  257/347
2015/0170916 A1* 6/2015 Yu ..................... H01L 21/02664
  438/493

* cited by examiner

SEMICONDUCTOR STRUCTURE WITH SHALLOW TRENCH ISOLATION AND MANUFACTURING METHOD THEREOF

FIELD

The present disclosure relates to a semiconductor structure, and more specifically to a structure of a shallow trench isolation (STI).

BACKGROUND

A significant trend throughout integrated circuit (IC) development is the downsizing of IC components. As the size reduces, the performance requirements become more stringent. Also, as devices continue to shrink in size, the channel region continues to shrink as well. For metal-oxide-semiconductor field effect transistors (MOSFETs), increased performance requirements have generally been met by aggressively scaling the length of the channel region. The goals of the semiconductor industry is to continue shrinking the size and increasing the speed of individual FETs at the same time. To achieve these goals, fin FETs (FinFETs) or multiple gate transistors are developed, wherein the FinFETs not only improve areal density and current performance but also improve gate control of the channel.

However, one challenge with the decreasing geometry of semiconductor ICs is the formation of unwanted residue in or on the semiconductor substrate. During formation of a shallow trench isolation (STI), it is difficult to define active regions in fine pitch regions because of a narrower line width. In addition, the trenches of the STI may suffer from a serious micro-loading effect between different pitch regions. A method or a profile of removing residue is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
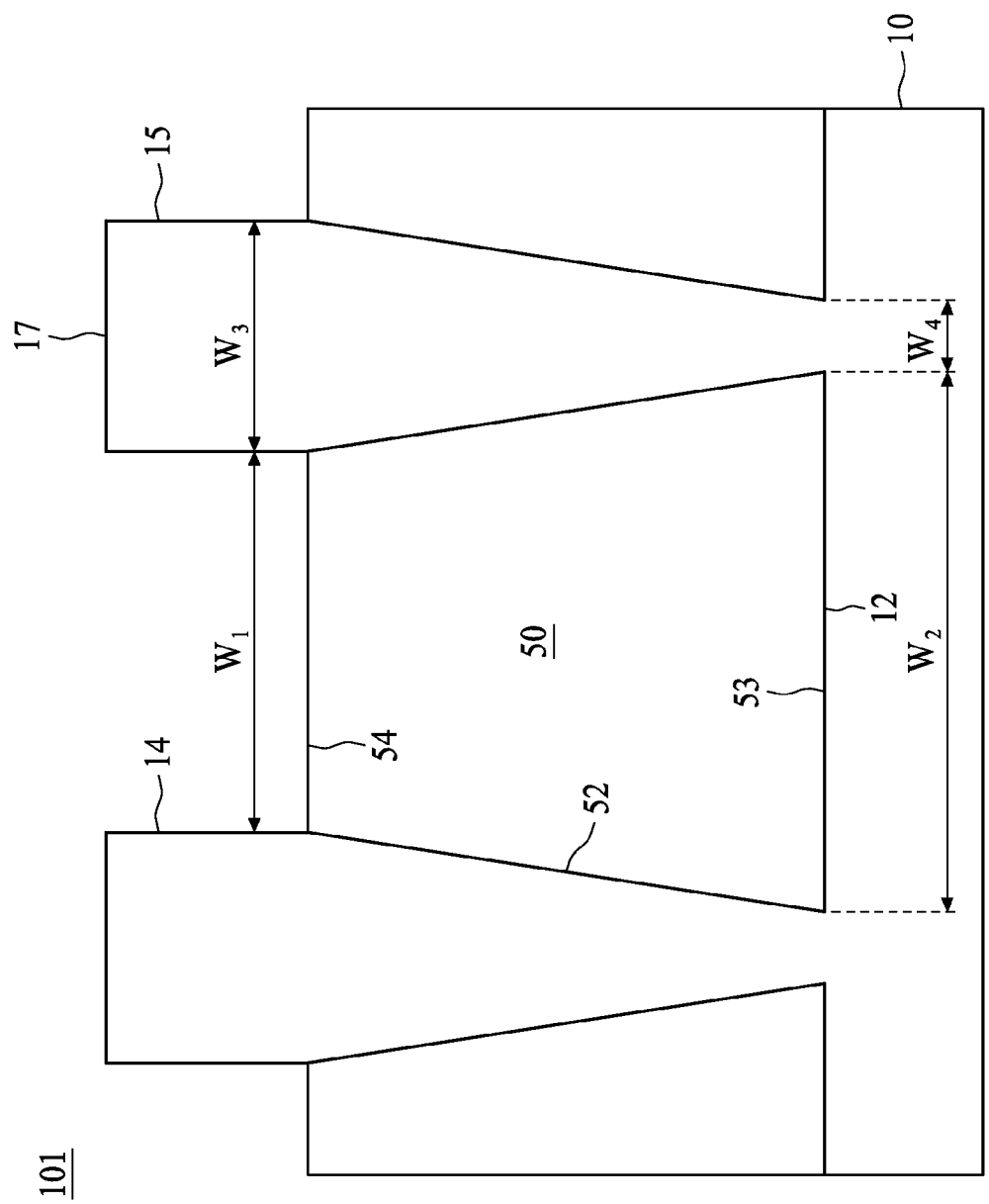
FIGS. 1A-1C are cross-sectional views illustrating STI profiles in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The term "isolation," as used herein, refers to an oxide structure or a dielectric structure for isolating devices. There are two typical formation processes, one is Local Oxidation of Silicon (LOCOS) and the other is Shallow Trench Isolation (STI).

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

There exists a continuing requirement to improve semiconductor device performance and scale down semiconductor devices. As the size reduces, the performance requirements become more stringent. One challenge for the decreasing geometry of semiconductor devices is the formation of unwanted residue in a narrow trench when performing an etching process. In the process of defining an active region, shallow trench isolation (STI) processes are performed on a semiconductor substrate. Several etching processes are performed to form trenches in the semiconductor substrate. The semiconductor substrate may include a fine pitch and a coarse pitch for active regions. In the fine pitch region, the active regions stand closely to each other so that a width of the trenches for STIs is designed to be narrower. However, it is difficult for reactive ions to enter into the narrow trenches and react with the semiconductor substrate during an etch process. Since the narrow trenches hinder the reactive ions, the narrow trenches will develop a shallower depth or an unintended profile of the trenches. After filling the dielectric material in the trenches, the STIs become shallower than expected and come out with a lower sheet resistance for doping wells, which may result in current leakage and influence the current performance.

Or in some cases, before forming the STIs, the manufacturers will set a target value for the well sheet resistance. In accordance with the well sheet resistance, trenches in a fine pitch region or in a coarse pitch region shall have a suitable depth for filling dielectric material. Unfortunately, in the fine pitch regions, a width of the trenches for STIs shall be designed to be narrower. It is difficult for reactive ions to enter into the narrow trenches and react with the semiconductor substrate. Since the narrow trenches hinder the reactive ions, the trenches will develop a shallower depth than previously expected. In this situation, the manufacturer will perform additional etching processes to encroach the residue in the narrow trenches. However, due to the micro-loading effect, the trenches in the coarse pitch regions will become much deeper. After the dielectric material is filled in the trenches, the well sheet resistance or electrical properties will alter and shift in different pitch regions. The well sheet resistance in the coarse pitch regions is larger than that in the fine pitch regions because of thicker STIs in the coarse pitch regions. In addition, the well sheet resistance in the coarse pitch regions will be larger than the target value set at the beginning. The altered well sheet resistance will influence the current performance of the semiconductor devices. As such, the residue in the trench and shifting of the well sheet resistance are issues for STI manufacturing processes. The present disclosure provides several STI profiles and manufacturing methods to solve the problems without changing a design rule.

Figure 1B:
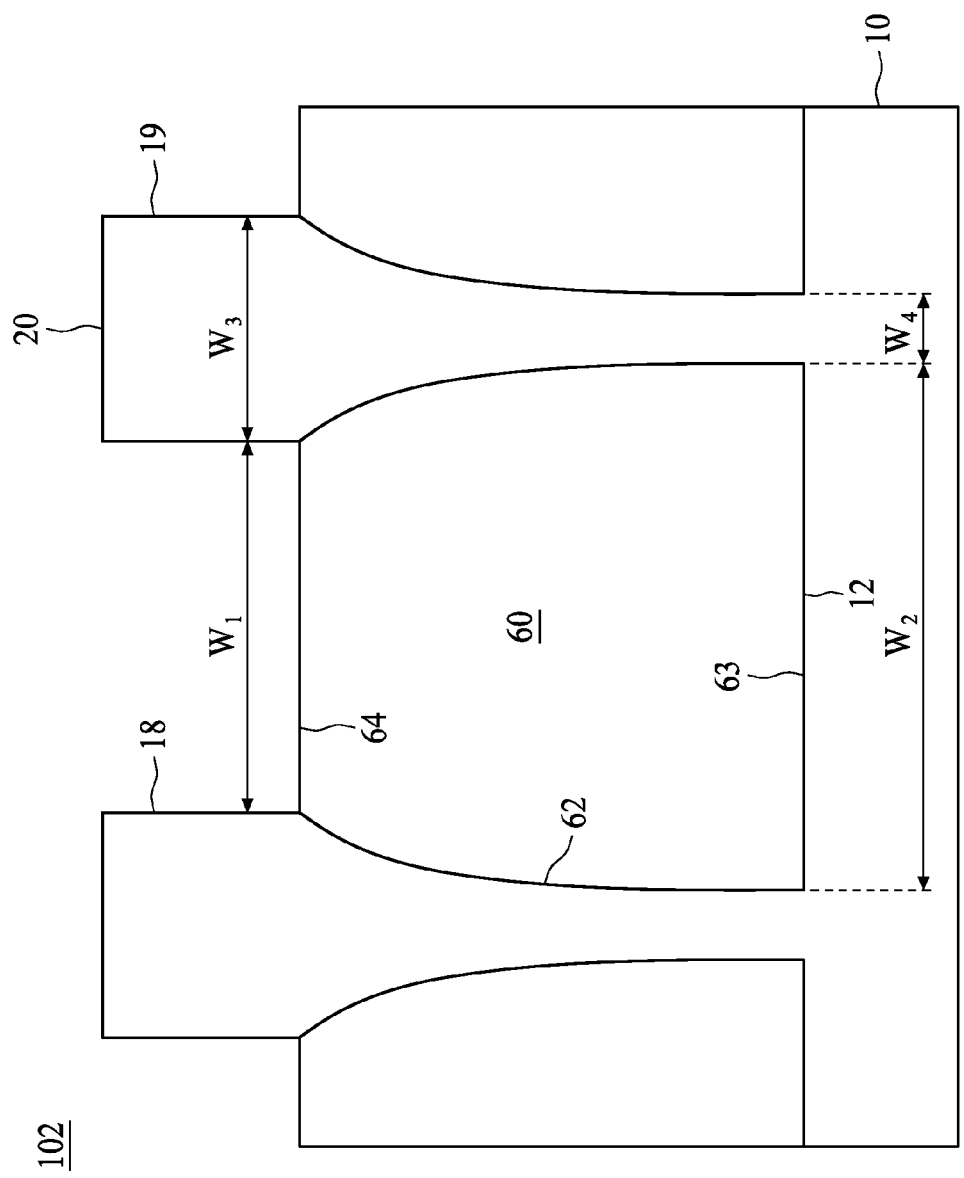
Figure 1C:
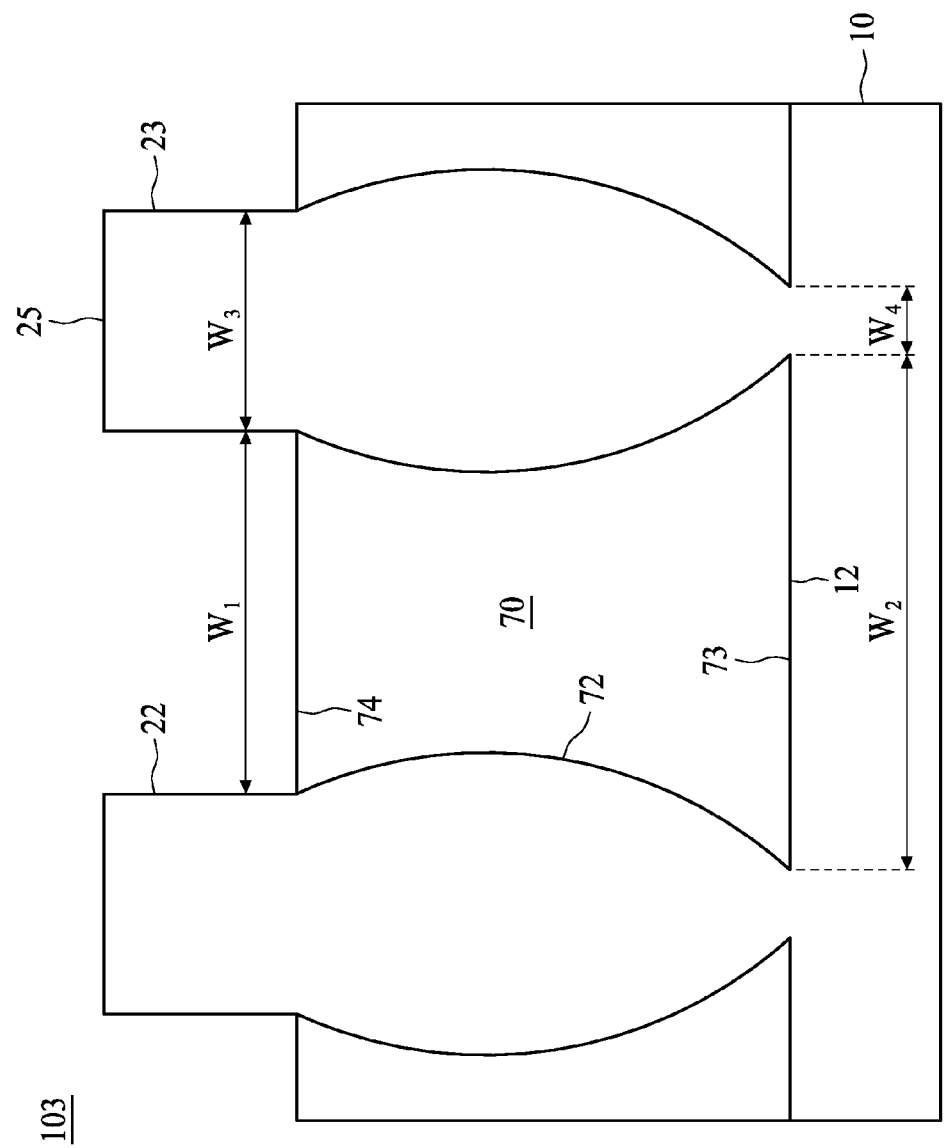

In reference to the figures, FIGS. 1A-1C are cross-sectional views illustrating STI profiles in accordance with some embodiments of the present disclosure. Referring to FIG. 1A, a structure 101 includes a semiconductor substrate 10 and an STI structure 50. The semiconductor substrate 10 includes fin structures 14 and 15, which extrude from a bottom portion 12 of the semiconductor substrate 10. The STI structure 50 is interposed between the fin structures 14 and 15, wherein a top surface 17 of the fin structure 15 is higher than a top surface 54 of the STI structure 50. Further, the STI structure 50 includes sidewalls 52 interfacing with the fin structures 14 and 15, wherein the sidewalls 52 are inclined surfaces. As such, the STI structure 50 is regarded as a trapezoid and includes a bottom surface 53 and a top surface 54 opposite to the bottom surface 53, wherein the bottom surface 53 contacts the bottom portion 12 of the semiconductor substrate 10. That is, the STI structure 50 extrudes from the bottom portion 12 of the semiconductor substrate 10. The bottom surface 53 includes a width W2 greater than a width W1 of the top surface 54. A width of the STI structure 50 gradually becomes greater from the top surface 54 to the bottom surface 53. Since the STI structure 50 interfaces with the fin structures 14 and 15, a sidewall of the fin structure 14 or 15 is complementary to a sidewall of the STI structure 50. As such, the fin structure 15 includes a top surface 17 with a width W3, and includes a bottom width W4 at a horizontal level of the bottom portion 12 of the semiconductor substrate 10, wherein the width W3 is greater than the bottom width W4. In some embodiments, the width W2 of the STI structure 50 is significant to the well sheet resistance instead of a neck width or the width W1 of the STI structure 50. It is noted that the width W2 contributes to a higher sheet resistance for doping wells. By adopting the profile of the STI structure 50, residue or voids formed between the fin structures 14 and 15 can be easily removed. Since the STI structure 50 provides a higher sheet resistance for the doping wells, the well sheet resistance or electrical properties will not alter and shift in different pitch regions, such as a fine pitch and a coarse pitch region. In addition, since the STI structure 50 grows laterally rather than vertically, the STI structure 50 will not become deeper vertically so that the micro-loading effect between different pitch regions can be avoided.

Referring to FIG. 1B, a structure 102 is similar to the structure 101, wherein the structure 102 includes an STI structure 60 and fin structures 18 and 19. The difference is that sidewalls 62 of the STI structure 60 are curved surfaces, wherein the curved surfaces are convex. The STI structure 60 includes sidewalls 62 and a bottom surface 63, wherein the sidewalls 62 interface with the fin structures 18 and 19. The bottom surface 63 interfaces with a bottom portion 12 of the semiconductor substrate 10. Similarly, the bottom surface 63 includes a width W2 greater than a width W1 of a top surface 64. A width of the STI structure 60 gradually increases from the top surface 64 to the bottom surface 63. The fin structure 19 includes a top surface 20 with a width W3, and includes a bottom width W4 at a horizontal level of the bottom portion 12 of the semiconductor substrate 10, wherein the width W3 is greater than the bottom width W4. Since the STI structure 60 interfaces with the fin structures 18 and 19, the fin structures 18 and 19 are shaped to have concave surfaces. The STI structure 60 provides a higher sheet resistance for doping wells, thus well sheet resistance or electrical properties will not alter and shift in different pitch regions, such as a fine pitch and a coarse pitch region. Current performance of the semiconductor devices with the STI structure 60 can also be improved.

Referring to FIG. 1C, a structure 103 is similar to the structure 101, whereas the difference is that sidewalls 72 of an STI structure 70 are shaped to have concave surfaces. A width of the STI structure 70 gradually becomes smaller from the top surface 74 at first and then increases toward the bottom surface 73. The STI structure 70 includes the sidewalls 72 and a bottom surface 73, wherein the sidewalls 72 interface with fin structures 22 and 23. The bottom surface 73 interfaces with a bottom portion 12 of the semiconductor substrate 10. Similarly, the bottom surface 73 includes a width W2 greater than a width W1 of a top surface 74. The fin structure 23 includes a top surface 25 with a width W3, and includes a bottom width W4 at a horizontal level of the bottom portion 12 of the semiconductor substrate 10, wherein the width W3 is greater than the bottom width W4. Since the STI structure 70 interfaces with the fin structures 22 and 23, the fin structures 22 and 23 are shaped to have convex surfaces. Bottom portions of the STI structure 70 are thicker laterally than other portions, which results in a higher sheet resistance for doping wells. By adopting the STI structure 70, the well sheet resistance or electrical properties will not alter and shift in different pitch regions. Residue between the fin structures 22 and 23 can be removed.

Figure 2A:
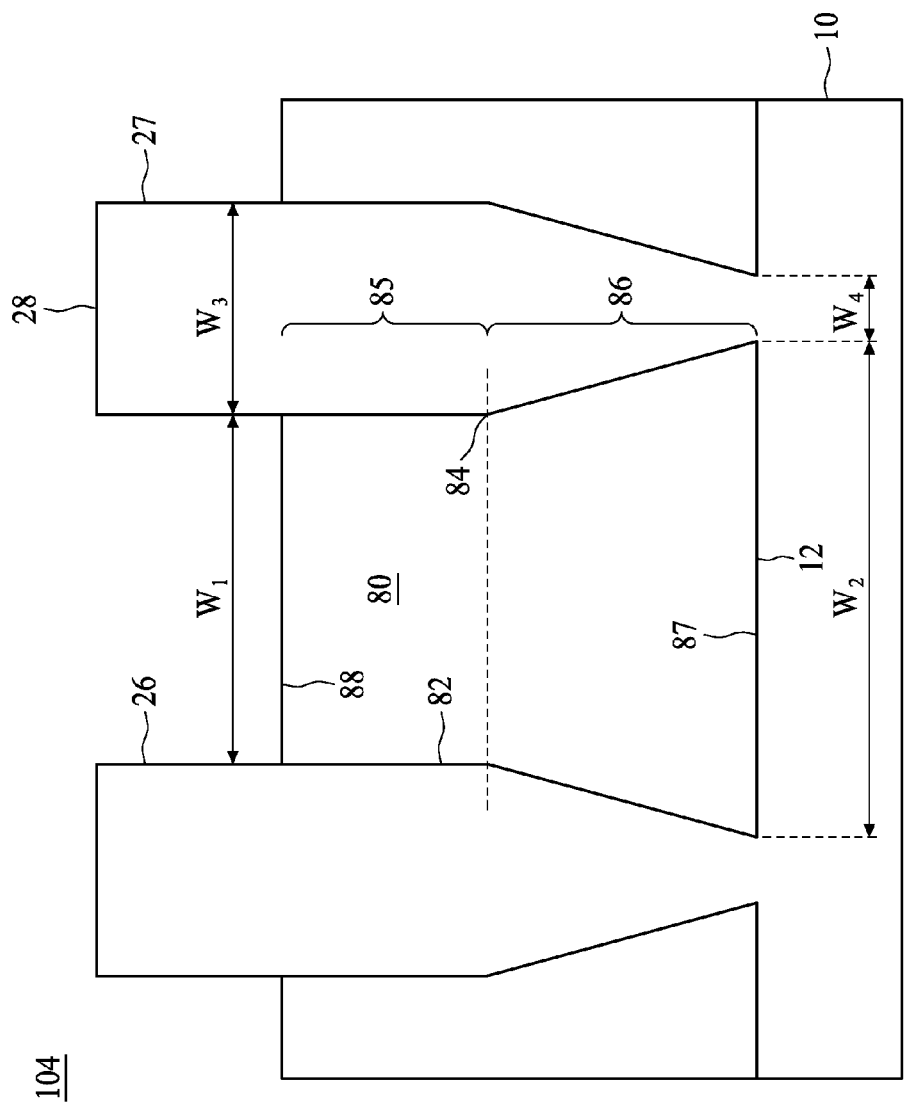
FIGS. 2A-2C are cross-sectional views illustrating STI profiles in accordance with some embodiments of the present disclosure.
Figure 2B:
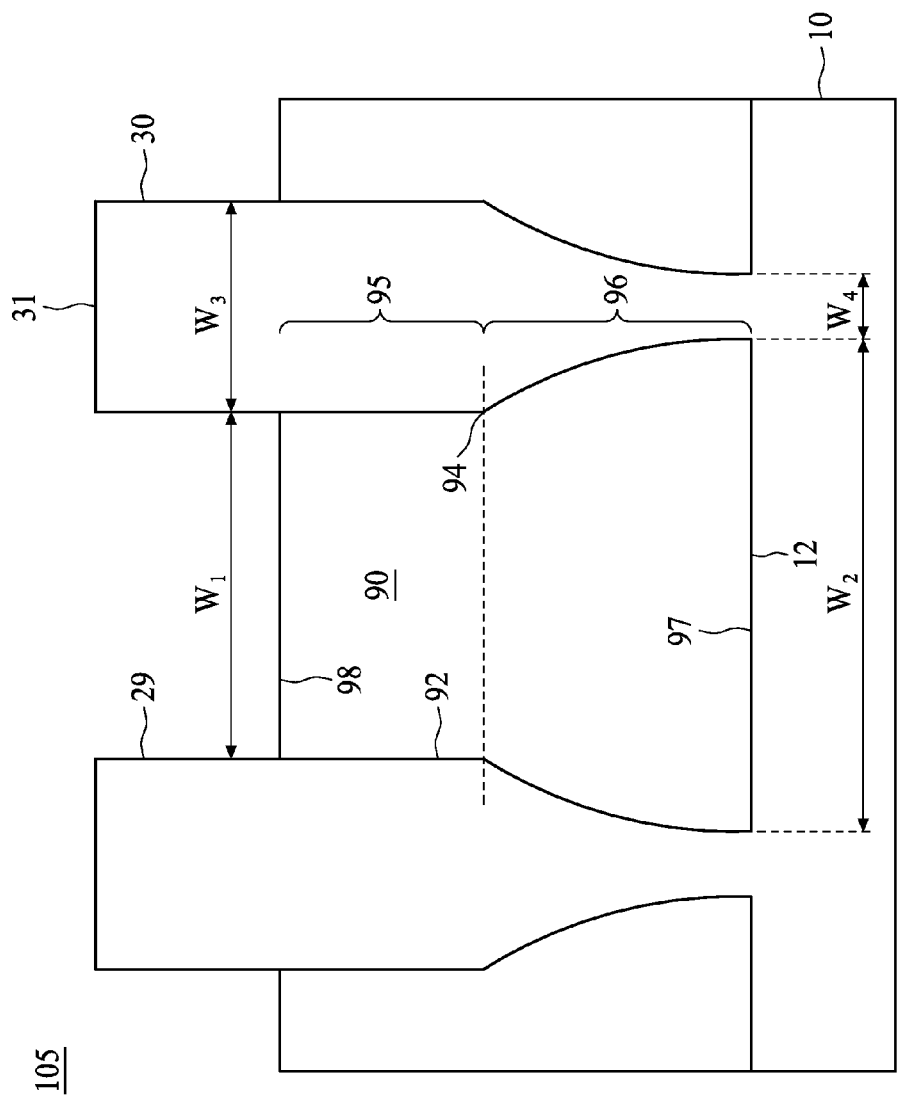
Figure 2C:
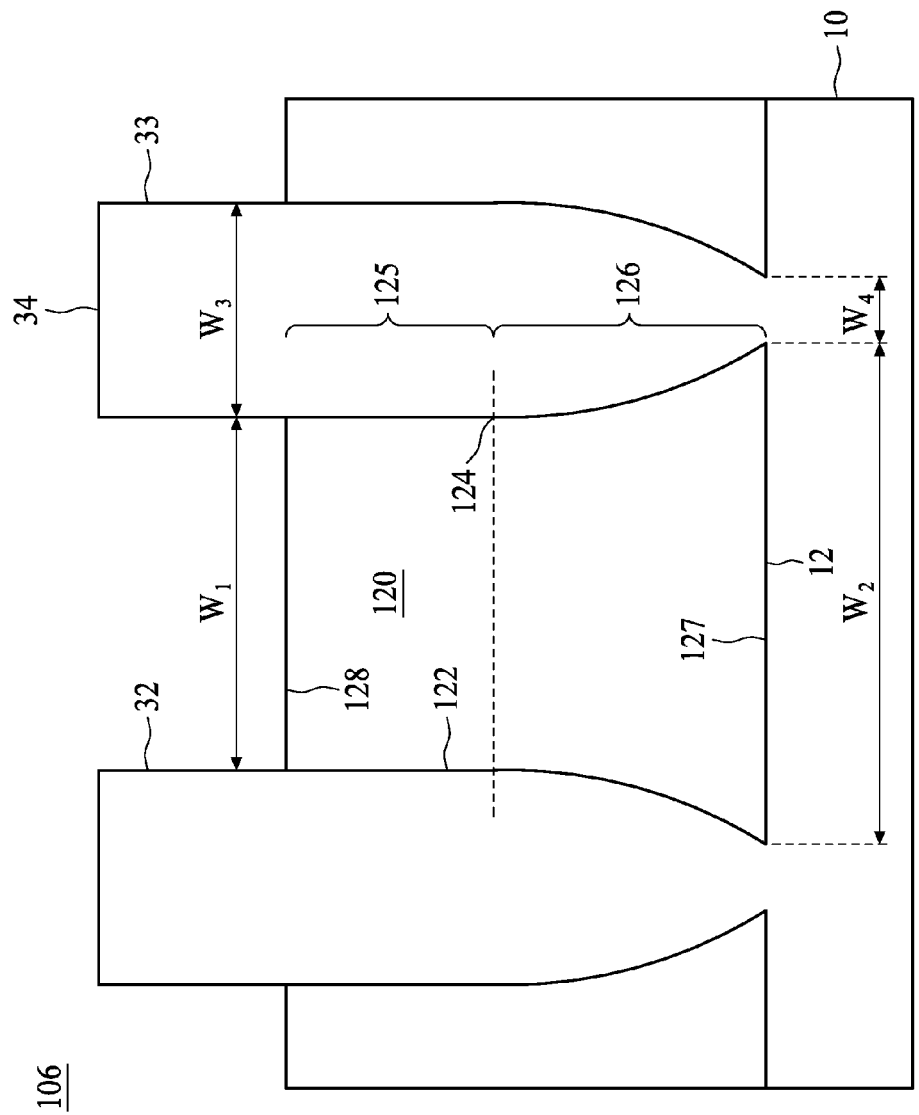

FIGS. 2A-2C are cross-sectional views illustrating STI profiles in accordance with some embodiments of the present disclosure. Referring to FIG. 2A, a structure 104 is similar to the structure 101, wherein the structure 104 includes an STI structure 80 and fin structures 26 and 27. The difference is that sidewalls 82 of the STI structure 80 include a turning point 84 where the STI structure 80 is divided into an upper portion 85 and a lower portion 86, wherein the lower portion 86 has an inclined surface. The upper portion 85 includes a constant width W1 and a width of the lower portion 86 increases from the turning point 84 to a bottom surface 87. The sidewalls 82 interface with the fin structures 26 and 27. The bottom surface 87 interfaces with a bottom portion 12 of the semiconductor substrate 10. The bottom surface 87 includes a width W2 greater than the width W1 of a top surface 88. The fin structure 27 includes a top surface 28 with a width W3, and includes a bottom width W4 at a horizontal level of the bottom portion 12 of the semiconductor substrate 10, wherein the width W3 is greater than the bottom width W4. With the lower portion 86, the STI structure 80 provides a higher sheet resistance for doping wells.

Referring to FIG. 2B, a structure 105 is similar to the structure 104, wherein the structure 105 includes an STI structure 90 and fin structures 29 and 30. The difference is that a lower portion 96 has a curved surface, wherein the curved surface is a convex surface. The STI structure 90 still includes the features of the STI structure 80; for example, sidewalls 92 of the STI structure 90 include a turning point 94 where the STI structure 90 is divided into an upper portion 95 and a lower portion 96. The upper portion 95 includes a constant width W1 and a width of the lower portion 96 increases from the turning point 94 to a bottom surface 97. The bottom surface 97 includes a width W2 greater than a width W1 of a top surface 98. The fin structure 30 includes a top surface 31 with a width W3, and includes a bottom width W4 at a horizontal level of a bottom portion 12 of the semiconductor substrate 10, wherein the width W3 is greater than the bottom width W4. A lower portion of the fin structure 30 has a curved surface, wherein a width of the fin structure 30 becomes smaller from the turning point 94 to the horizontal level of the bottom portion 12. With the lower portion 96, the STI structure 90 provides a higher sheet resistance for doping wells.

Referring to FIG. 2C, a structure 106 is similar to the structure 104, wherein the structure 106 includes an STI structure 120 and fin structures 32 and 33. The difference is that a lower portion 126 of the STI structure 120 has a curved surface, wherein the curved surface is a concave surface. The STI structure 120 includes the features of the STI structure 80; for example, sidewalls 122 of the STI structure 120 include a turning point 124 where the STI structure 120 is divided into an upper portion 125 and the lower portion 126. The upper portion 125 includes a constant width W1 and a width of the lower portion 126 increases from the turning point 124 to a bottom surface 127.

The bottom surface 127 includes a width W2 greater than a width W1 of a top surface 128. The fin structure 33 includes a top surface 34 with a width W3, and includes a bottom width W4 at a horizontal level of a bottom portion 12 of the semiconductor substrate 10, wherein the width W3 is greater than the bottom width W4. A width of the fin structure 33 becomes smaller from the turning point 124 to the horizontal level of the bottom portion 12. With the lower portion 126, the STI structure 120 provides a higher sheet resistance for doping wells.

Figure 3A:
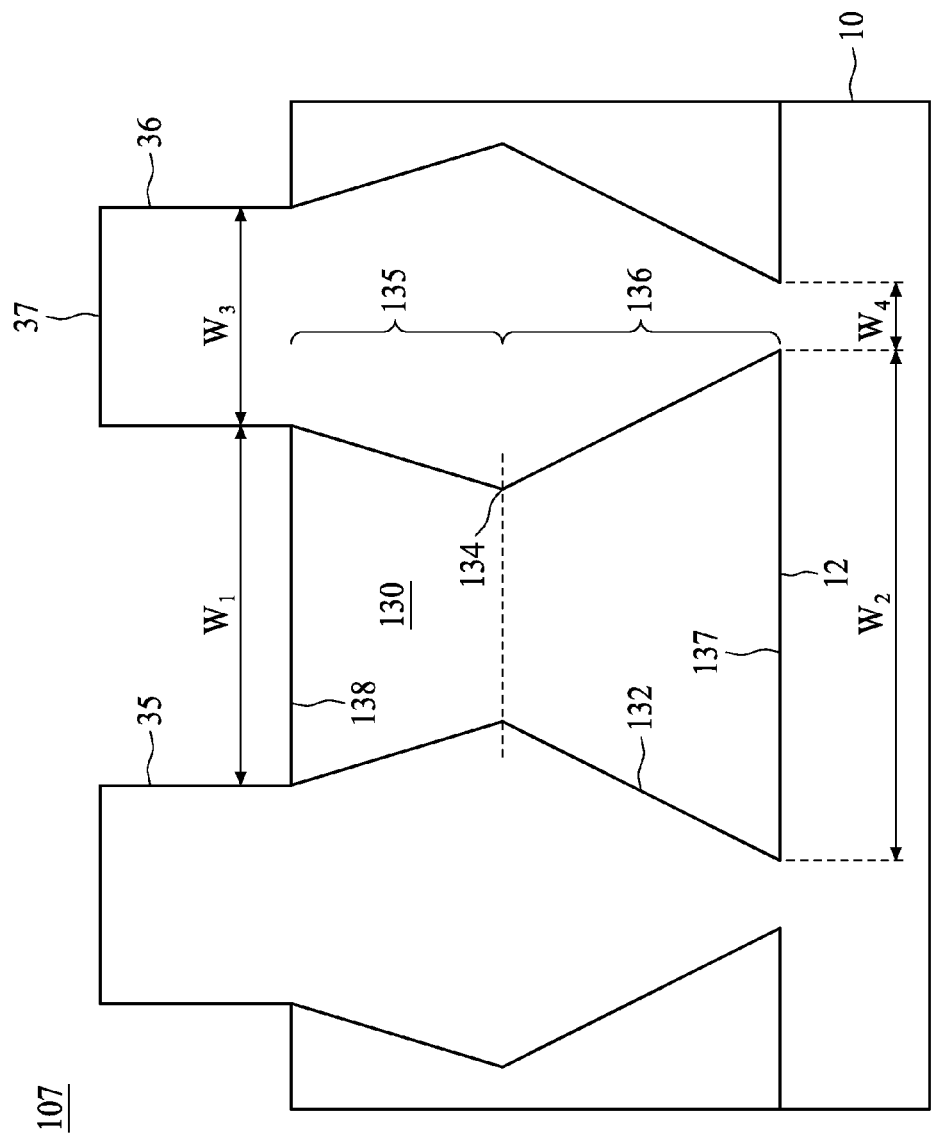
FIGS. 3A-3C are cross-sectional views illustrating STI profiles in accordance with some embodiments of the present disclosure.
Figure 3B:
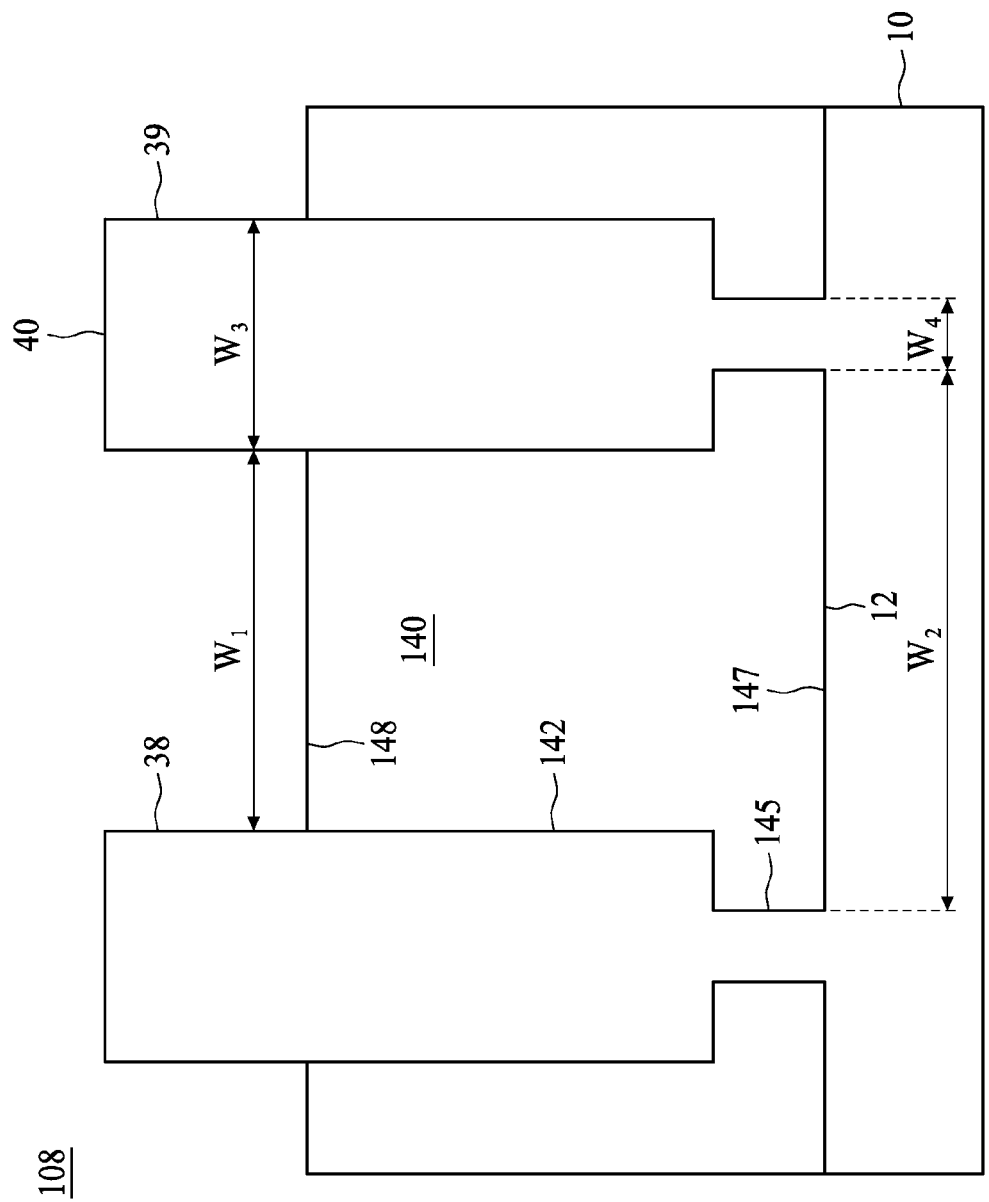
Figure 3C:
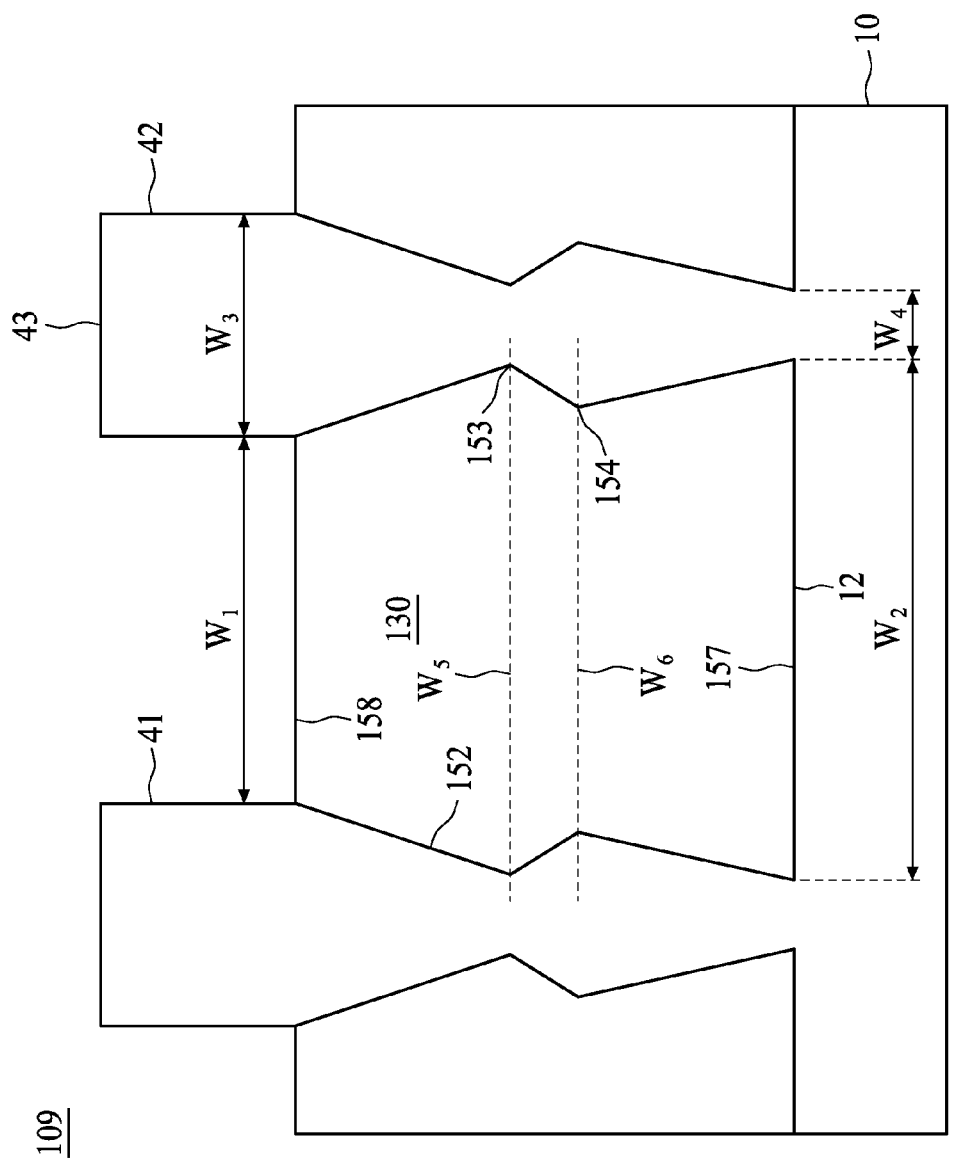

FIGS. 3A-3C are cross-sectional views illustrating STI profiles in accordance with some embodiments of the present disclosure. Referring to FIG. 3A, a structure 107 is similar to the structure 104, wherein the structure 107 includes an STI structure 130 and fin structures 35 and 36. The difference is that an upper portion 135 has an inclined surface, wherein a width of the upper portion 135 becomes smaller from a top surface 138 to a turning point 134. A width of a lower portion 136 increases from the turning point 134 to a bottom surface 137. The STI structure 130 still includes the features of the STI structure 80; for example, the bottom surface 137 includes a width W2 greater than a width W1 of the top surface 138. The fin structure 36 includes a top surface 37 with a width W3, and includes a bottom width W4 at a horizontal level of a bottom portion 12 of the semiconductor substrate 10, wherein the width W3 is greater than the bottom width W4. The body of the fin structure 36 is shaped to have a diamond-like pillar. With the lower portion 136, the STI structure 130 provides a higher sheet resistance for doping wells. In another embodiment, a width (not shown) at the turning point 134 is greater than the width W1 of the top surface 138; and the width W2 of the bottom surface 137 is greater than the width at the turning point 134. A width of the STI structure gradually increases from the top surface 138 to the bottom surface 137.

Referring to FIG. 3B, a structure 108 includes an STI structure 140 and fin structures 38 and 39. Particularly, the STI structure 140 includes a lateral protrusion 145 adjacent to a bottom surface 147 of STI structure 140. The STI structure 140 extends from a top surface 148 to the lateral protrusion 145 with a constant width W1. The lateral protrusion 145 of the STI structure 140 has a width W2 greater than the width W1. The STI structure 140 also includes some features similar to the STI structure 80; for example, the bottom surface 147 includes the width W2 greater than the width W1 of the top surface 148. The fin structure 39 includes a top surface 40 with a width W3, and a bottom width W4 at a horizontal level of a bottom portion 12 of the semiconductor substrate 10, wherein the width W3 is greater than the bottom width W4. A width of the fin structure 39 becomes smaller at horizontal level of the bottom portion 12. With the lateral protrusion 145, the STI structure 140 provides a higher sheet resistance for doping wells.

Referring to FIG. 3C, a structure 109 includes an STI structure 150 and fin structures 41 and 42. Particularly, sidewalls 152 of the STI structure 150 include at least two turning points where the STI structure 150 includes different widths at each turning point. For example, a first turning point 153 includes a width W5; and a second turning point 154 includes a width W6. The width W5 is equal to or greater than a width W2 of a bottom surface 157. The width W6 is equal to or greater than a width W1 of a top surface 158. The STI structure 150 still includes some features similar to the STI structure 80; for example, the width W2 is greater than the width W1 of the top surface 158. The fin structure 42 has a top surface 43 with a width W3, and a bottom width W4 at a horizontal level of a bottom portion 12 of the semiconductor substrate 10, wherein the width W3 is greater than the bottom width W4. A width of the fin structure 42 alters along with the sidewalls of the STI structure 150. With the width W2, the STI structure 150 provides a higher sheet resistance for doping wells.

Figure 4:
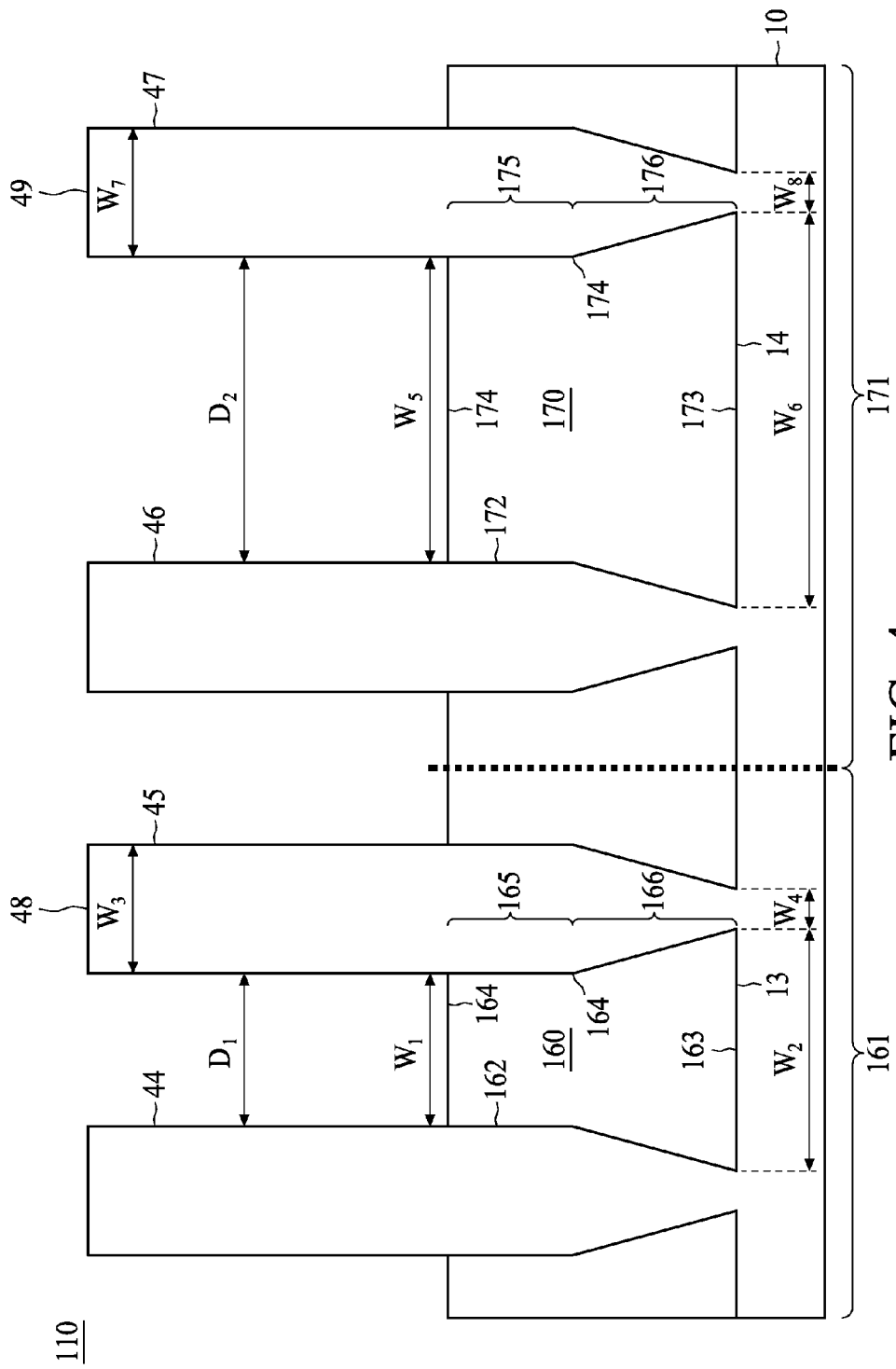
FIG. 4 is a cross-sectional view illustrating an STI profile in accordance with some embodiments of the present disclosure.

FIG. 4 is a cross-sectional view illustrating an STI profile in accordance with some embodiments of the present disclosure. A structure 110 includes a semiconductor substrate 10, a first shallow trench isolation (STI) 160 and a second shallow trench isolation (STI) 170, wherein the first STI 160 is located in a first region 161 and the second STI 170 is located in a second region 171 of the semiconductor substrate 10. Further, the semiconductor substrate 10 includes fin structures 44, 45, 46 and 47, which extrude from bottom portions 13 and 14 of the semiconductor substrate 10 respectively. The fin structures 44 and 45 are located in the first region 161 and the fin structures 46 and 47 are located in the second region 171. There is a distance D1 between the fin structures 44 and 45 and a distance D2 between the fin structures 46 and 47. The distance D1 is smaller than the distance D2, wherein the first region 161 refers to a fine pitch regions and the second region 171 refers to a coarse pitch regions. The first STI 160 includes sidewalls 162, a bottom surface 163 and a top surface 164 opposite to the bottom surface 163. The sidewalls 162 interface with the fin structures 44 and 45, wherein the first STI 160 is interposed between the fin structures 44 and 45. The bottom surface 163 contacts the bottom portion 13 of the semiconductor substrate 10, wherein the first STI 160 extrudes from the bottom portion 13 vertically. Particularly, the bottom surface 163 includes a width W2 greater than a width W1 of the top surface 164. The sidewalls 162 of the first STI 160 includes a turning point 164 where the first STI 160 is divided into an upper portion 165 and a lower portion 166, wherein the lower portion 166 is an inclined surface. The upper portion 165 includes a constant width W1 equal to the distance D1. A width of the lower portion 166 increases from the turning point 164 to the bottom surface 163. The fin structure 45 includes a top surface 48 with a width W3, and includes a bottom width W4 at a horizontal level of the bottom portion 13 of the semiconductor substrate 10, wherein the width W3 is greater than the bottom width W4.

Similarly, the second STI 170 includes sidewalls 172, a bottom surface 173 and a top surface 174 opposite to the bottom surface 173. The sidewalls 172 interface with the fin structures 46 and 47, wherein the second STI 170 is interposed between the fin structures 46 and 47. The bottom surface 173 contacts the bottom portion 14 of the semiconductor substrate 10, wherein the second STI 170 extrudes from the bottom portion 14 vertically. Particularly, the bottom surface 173 includes a width W6 greater than a width W5 of the top surface 174. The sidewalls 172 of the second STI 170 include a turning point 174 where the second STI 170 is divided into an upper portion 175 and a lower portion 176, wherein the lower portion 176 is an inclined surface. The upper portion 175 includes a constant width W5 equal to the distance D2. A width of the lower portion 176 increases from the turning point 174 to the bottom surface 173. The fin structure 47 includes a top surface 49 with a width W7, and includes a bottom width W8 at a horizontal level of the bottom portion 14 of the semiconductor substrate 10, wherein the width W7 is greater than the bottom width W8. Since the first STI 160 and the second STI 170 grow laterally adjacent to the bottom portions 13 and 14 rather than vertically, the second STI 170 will not become deeper vertically so that the micro-loading effect between the first and second regions 161 and 171 can be mitigated. The micro-loading effect is mitigated, thus the bottom surface 163 of the first STI 160 is substantially equal to the horizontal level of the bottom surface 173 of the second STI 170. That is, the bottom portion 13 has the same horizontal level as the bottom portion 14. In addition, the greater width W2 and width W6 will compensate for the sheet resistance so as to obtain a proximally constant value. As such, the well sheet resistance values in the first region 161 and the second region 171 will be equivalent to the target value set at the beginning. The well sheet resistance or electrical properties will not alter and shift in different pitch regions so that the current performance of the devices can be improved.

Figure 5:
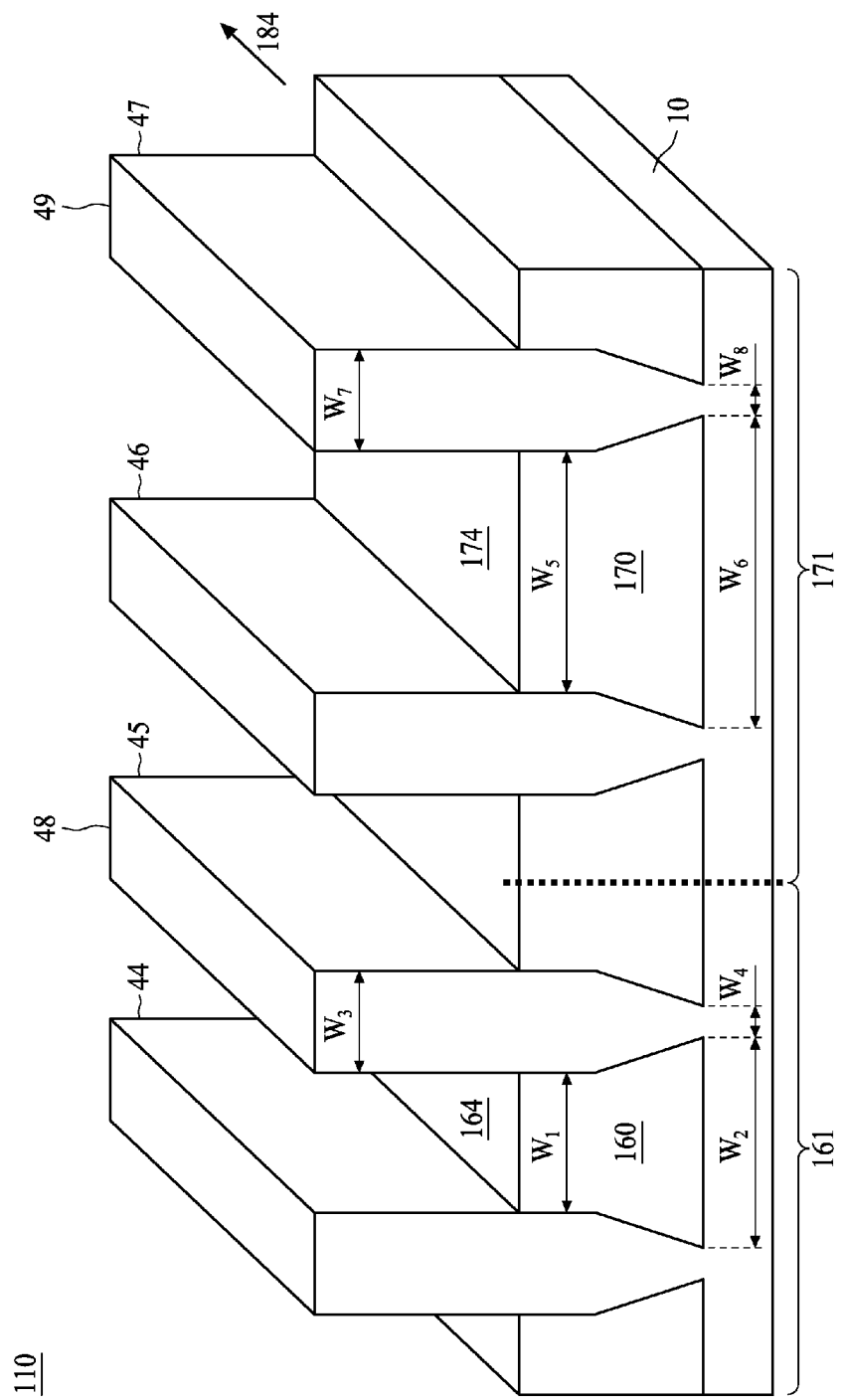
FIG. 5 is a three-dimensional view illustrating the structure of FIG. 4 in accordance with some embodiments of the present disclosure.

FIG. 5 is a three-dimensional view illustrating the structure 110 of FIG. 4 in accordance with some embodiments of the present disclosure. The first STI 160 and the second STI 170 are actually strip-like structures and extend toward a direction 184 parallelly. The width W1 is smaller than the width W5 where the first region 161 refers to a fine pitch region and the second region 170 refers to a coarse pitch region. Further, the first STI 160 separates the fin structures 44 and 45. The second STI 170 separates the fin structures 46 and 47 so as to define active regions for Fin-FETs. Each fin structure is isolated by the STI structures, wherein each fin structure is parallel to each STI structure; for example, the first STI 160 is parallel to the fin structure 44. The top surface 164 is lower than the top surface 48; and the top surface 174 is lower than the top surface 49, wherein the top surface 48 has the same horizontal level as the top surface 49.

Figure 6:
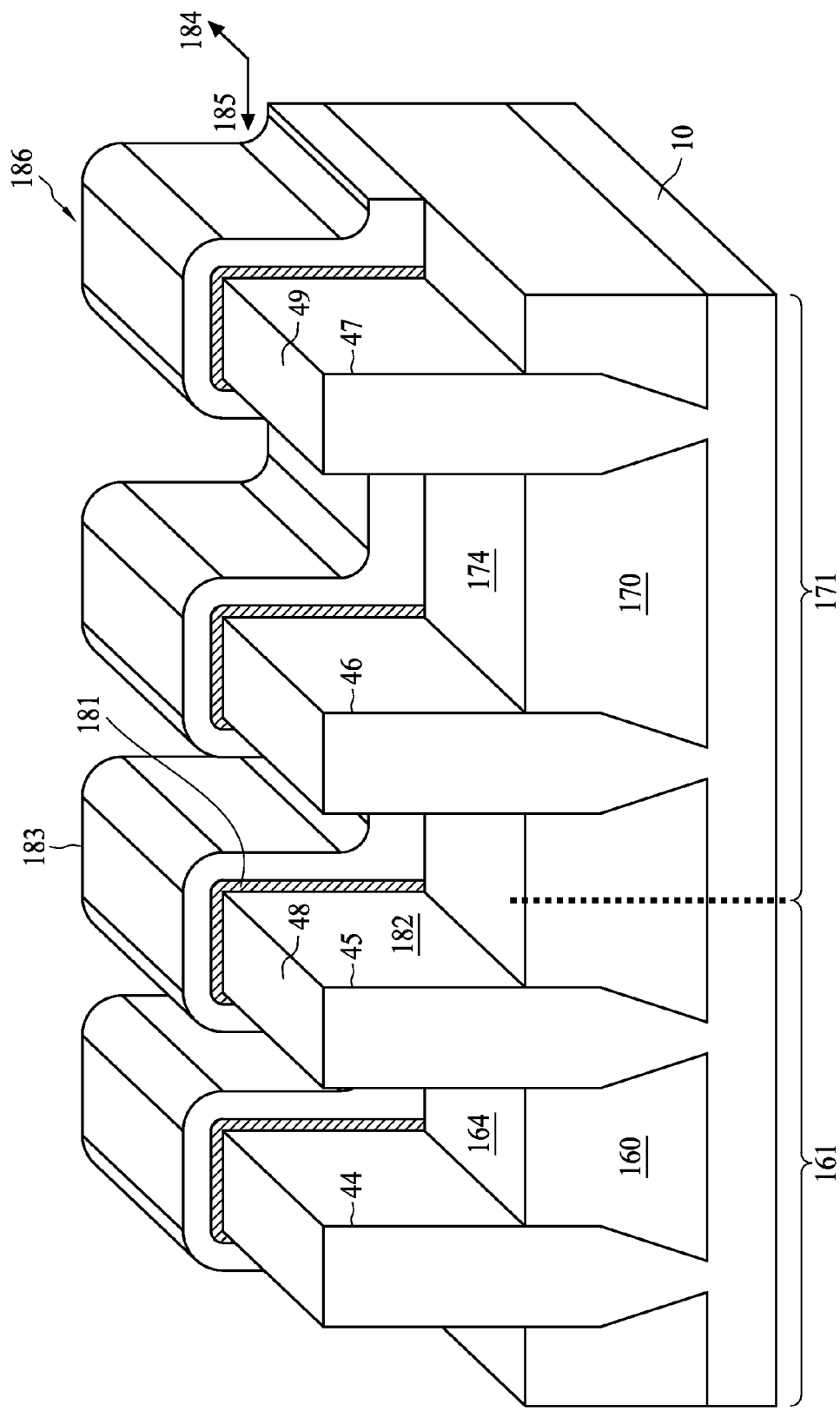
FIG. 6 is a three-dimensional view illustrating the structure of FIG. 4 in accordance with some embodiments of the present disclosure.

FIG. 6 is a three-dimensional view illustrating the structure 110 of FIG. 4 in accordance with some embodiments of the present disclosure. A gate structure 186 is disposed over the semiconductor substrate 10, the first STI 160 and the second STI 170. The gate structure 186 includes a gate dielectric layer 181 and a gate electrode 183. The gate dielectric layer 181 is disposed on the top surface and sidewalls of the fin structures; for example, the gate dielectric layer 181 is disposed on the top surface 48 and sidewalls 182 of the fin structure 45. That is, the gate dielectric layer 181 is conformal to each fin structure above a horizontal level of the top surfaces 164 or 174. Further, the gate electrode 183 is disposed over the gate dielectric layer 181 and the STI structures, such as the first STI 160 and the second STI 170. A direction 185 of the gate electrode 183 is orthogonal to the direction 184 of the STI structures or the fin structures. As such, the gate structure 186 extends from the first region 161 to the second region 171. The gate structure 186 is able to control the on/off switch and current performance of the fin structures 44, 45, 46 and 47 in the first and second regions 161 and 171.

Figure 7:
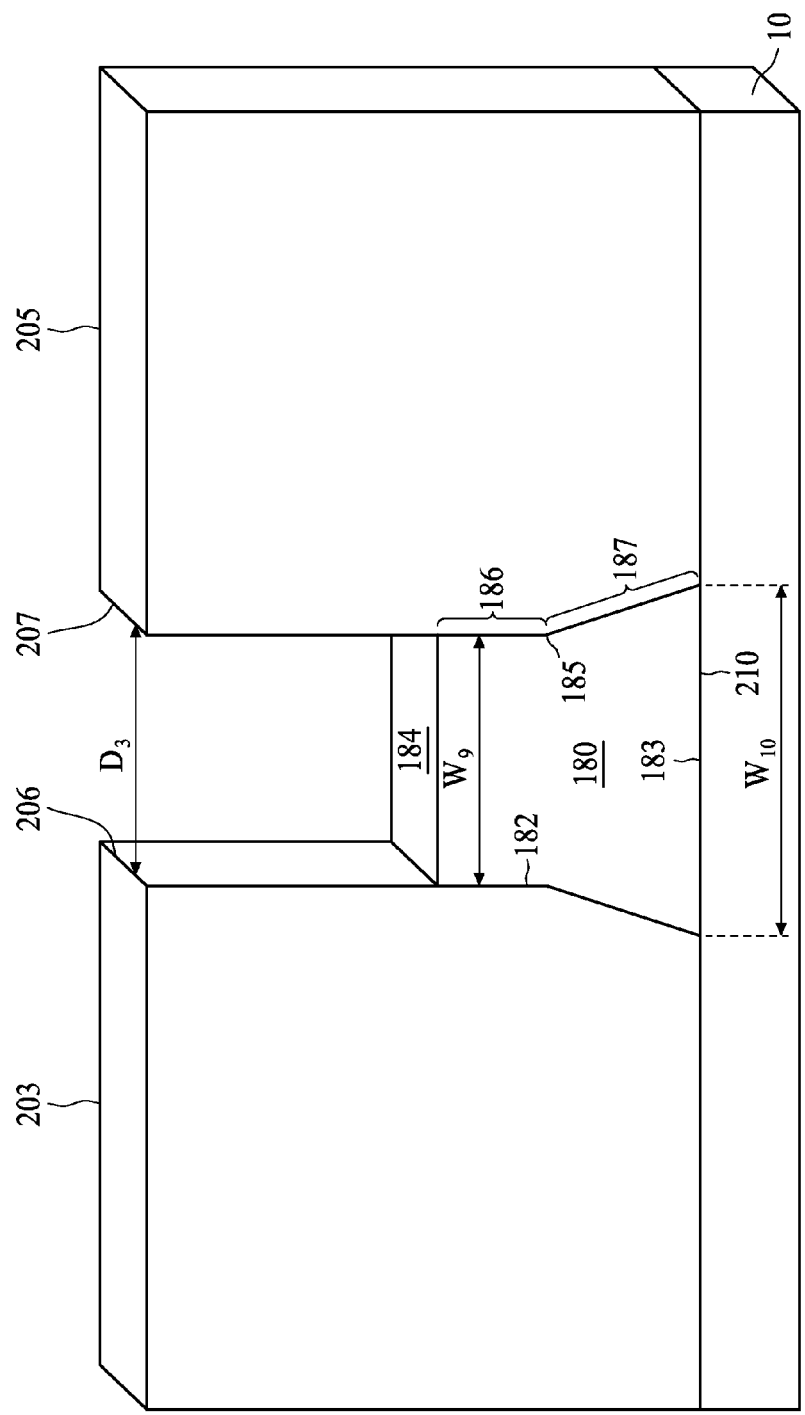
FIG. 7 is a three-dimensional view illustrating an STI profile in accordance with some embodiments of the present disclosure.

FIG. 7 is a three-dimensional view illustrating an STI profile in accordance with some embodiments of the present disclosure. A semiconductor substrate 10 includes a fin structure 203 and a fin structure 205, wherein the fin structures 203 and 205 extrude from a bottom portion 210 of the semiconductor substrate 10. The fin structure 203 is apart from the fin structure 205 with a distance D3, wherein the fin structures 203 and 205 are on the same straight line. Particularly, a short edge 206 of the fin structure 203 faces to a short edge 207 of the fin structure 205. An STI structure 180 is disposed on the semiconductor substrate 10. Further, the STI structure 180 includes sidewalls 182, a bottom surface 183 and a top surface 184 opposite to the bottom surface 183. The sidewalls 182 interface with the fin structures 203 and 205, wherein the STI structure 180 is interposed between the fin structures 203 and 205. The bottom surface 183 contacts the bottom portion 210 of the semiconductor substrate 10, wherein the STI structure 180 extrudes from the bottom portion 210 vertically. Particularly, the bottom surface 183 includes a width W10 greater than a width W9 of the top surface 184. The sidewalls 182 of the STI structure 180 include a turning point 185 where the STI structure 180 is divided into an upper portion 186 and a lower portion 187, wherein the lower portion 187 is an inclined surface. The upper portion 186 includes the width W9 equal to the distance D3. A width of the lower portion 187 increases from the turning point 185 to the bottom surface 183. By adopting the profile of the STI structure 180, residue or voids formed between the fin structures 203 and 205 can be easily removed.

FIGS. 8A-8H represent a method of manufacturing a structure 110 as in FIG. 4 in accordance with some embodiments of the present disclosure. Each figure represents a stage of the method in a cross-sectional perspective view.

Figure 8A:
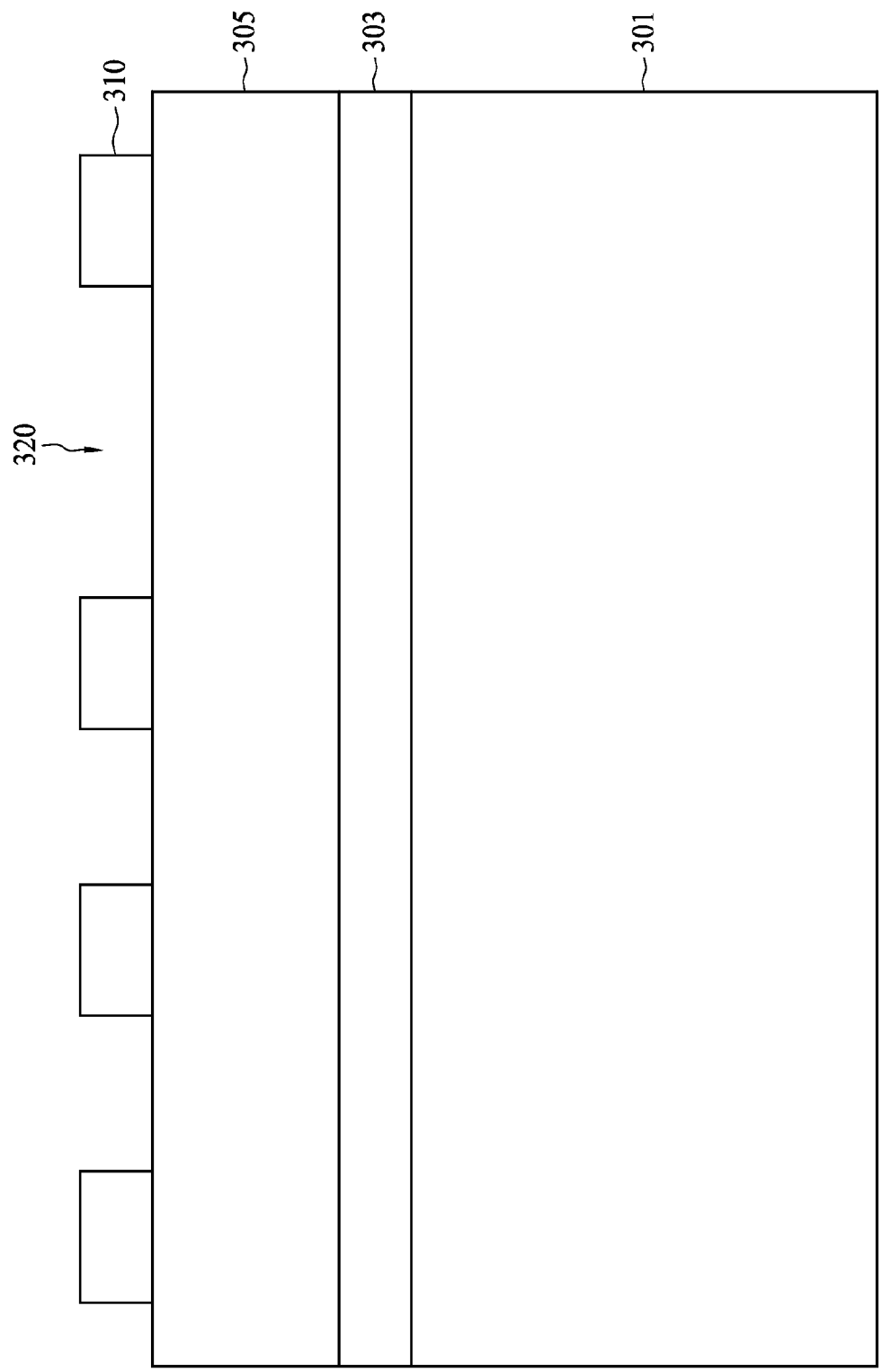
FIGS. 8A-8H illustrate a method of manufacturing the structure of FIG. 4 in accordance with some embodiments of the present disclosure.

Referring to FIG. 8A, a pad layer 303 and a mask layer 305 are formed over a semiconductor substrate 301, wherein the pad layer 303 is formed between the mask layer 305 and the semiconductor substrate 301. A patterned photoresist layer 310 is formed on the mask layer 305. The semiconductor substrate 301, for example, is a silicon substrate, an epitaxial layer, or a SOI substrate. The pad layer 303, for example, is a thin film including silicon oxide, which is thermally grown or deposited by CVD or PVD. The pad layer 303 primarily serves as a stress buffer layer or an adhesion layer between the semiconductor substrate 301 and the mask layer 305. In addition, the pad layer 303 also acts as an etch stop layer when etching the mask layer 305. The mask layer 305 is formed of silicon nitride, for example, using low-pressure chemical vapor deposition (LPCVD), thermal nitridation of silicon, plasma enhanced chemical vapor deposition (PECVD), or plasma anodic nitridation. The mask layer 305 is used as a hard mask during subsequent photolithography processes. Before forming the patterned photoresist layer 310, an anti-reflection coating (ARC) layer (not shown) is chosen to be disposed on the mask layer 305. The anti-reflection coating (ARC) is a bottom anti-reflection coating (BARC) or a dielectric anti-reflection coating (DARC). The ARC includes silicon oxynitride, a spin-on polymer, and/or other suitable material. Regarding the formation of the patterned photoresist layer 310, the patterned photoresist layer 310 is formed by adopting a photolithography process including photoresist coating, soft baking, exposing, post-exposure baking (PEB), developing, and hard baking. A photosensitive layer is deposited in a suitable manner such as spin-on coating. The photosensitive layer is then exposed and developed so as to form the patterned photoresist layer 310 by utilizing a lithography tool (e.g., optical lithography tool or e-beam writer) and a developing solution. The radiation beam used for the lithography tool can be an ultraviolet beam, ion beam, x-ray, extreme ultraviolet, deep ultraviolet, and other proper radiation projections. After the above processes are finished, a predetermined pattern on a mask is transferred to the patterned photoresist layer 310 so as to form openings 320, wherein the openings 320 of the patterned photoresist layer 310 correspond to the pattern of the mask.

Figure 8B:
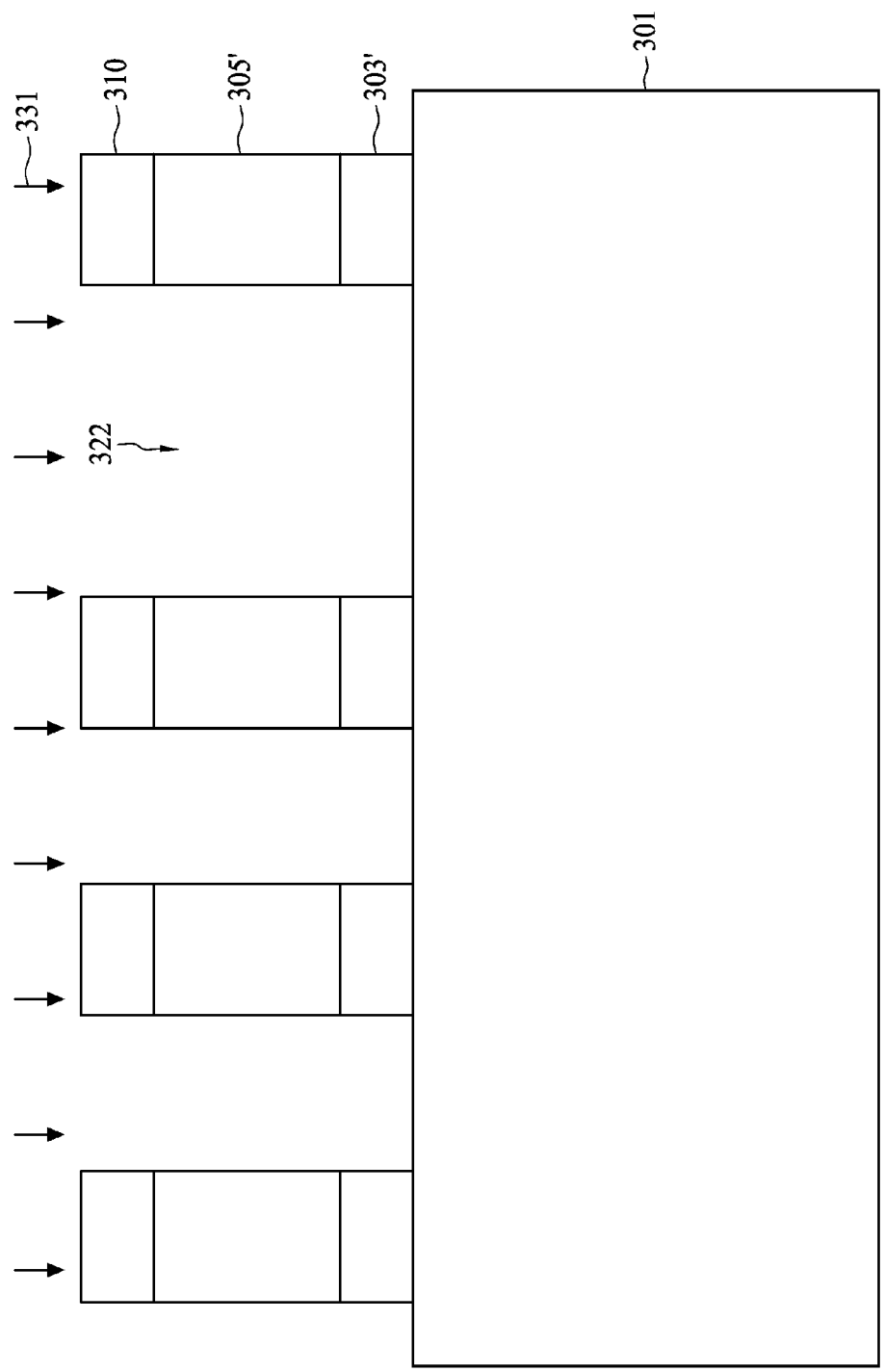

Referring to FIG. 8B, a first etching process 331 is performed therein and shown as arrows indicating ion streams. The first etching process 331 includes chemical molecule, which is ionized and reacts with materials of the pad layer 303 and the mask layer 305. The pad layer 303 and the mask layer 305 are etched through the openings 320, thus exposing the underlying semiconductor substrate 301. Further, the pad layer 303 and mask layer 305 are etched to form openings 322 and transformed into a pad layer 303' and a mask layer 305'. The openings 322 expose portions of the semiconductor substrate 301. The first etching process 331 utilizes a dry etching process with an anisotropic feature, such as a reactive ion etch (RIE). The first etching process 331 includes the chemical molecule, such as $Cl_2$, $SF_6$, $N_2$, $CF_4$, CHF), $CH_2F_2$, $N_2H_2$, $O_2$, He or Ar. The power of the first etching process 331 ranges from about 100 W to about 1500 W.

Figure 8C:
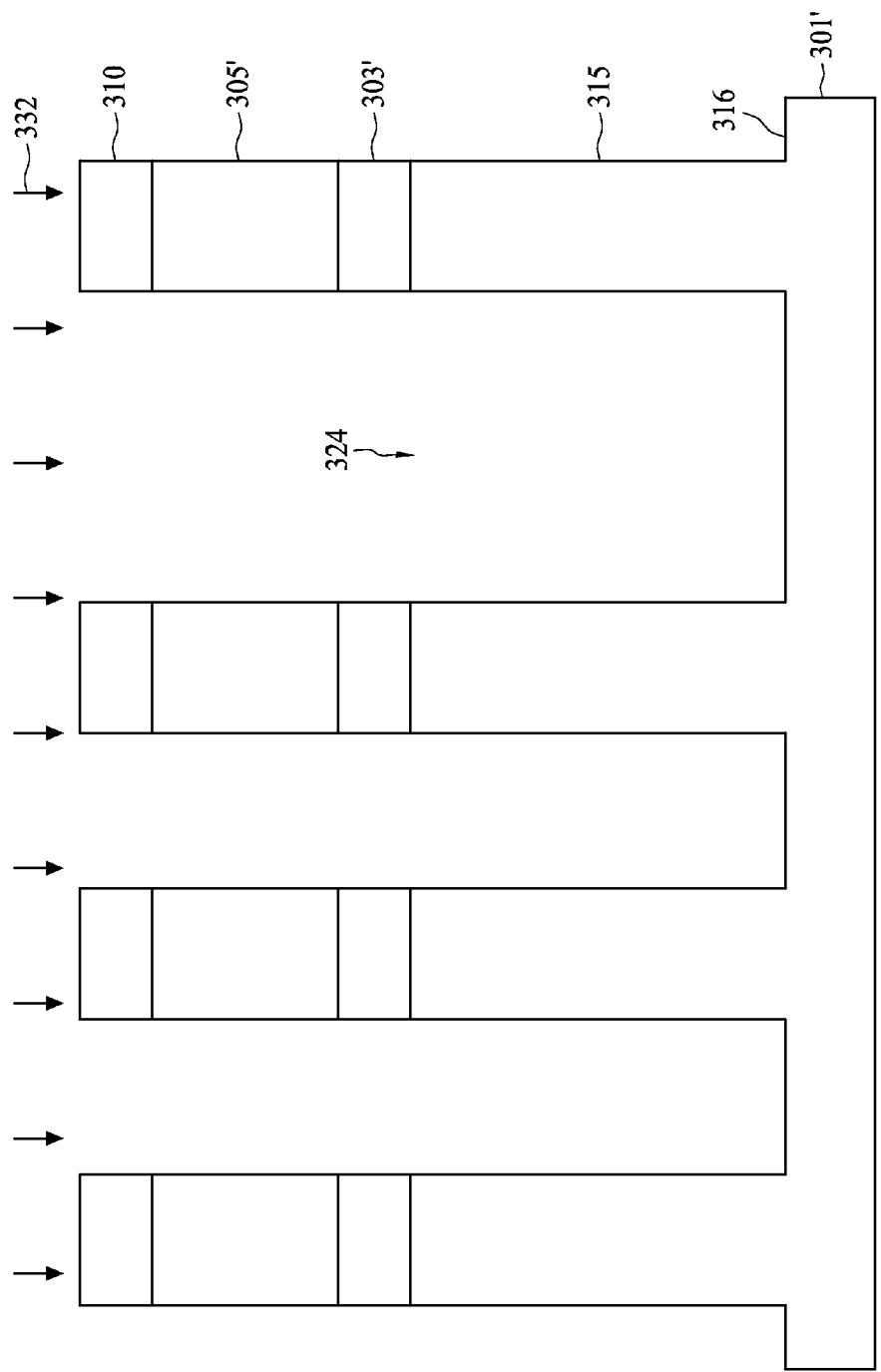

Referring to FIG. 8C, a second etching process 332 is performed therein and shown as arrows indicating ion streams. The second etching process 332 includes chemical molecule, which is ionized and reacts with materials of the semiconductor substrate 301. The semiconductor substrate 301 is etched through the openings 322, thus forming a trench 324 and fin structures. Further, the semiconductor substrate 301 is etched and transformed into a semiconductor substrate 301', wherein the semiconductor substrate 301' is shaped to have fin structures, such as a fin structure 315, extruding from a bottom portion 316 of the semiconductor substrate 301'. The second etching process 332 utilizes a dry etching process with an anisotropic feature, such as a reactive ion etch (RIE). The second etching process 332 includes the chemical molecule, such as $Cl_2$, HBr, $N_2$, $CF_4$, $CHF_3$, $CH_2F_2$, $N_2H_2$, $O_2$, He or Ar. The power of the second etching process 332 ranges from about 100 W to about 1500 W.

Figure 8D:
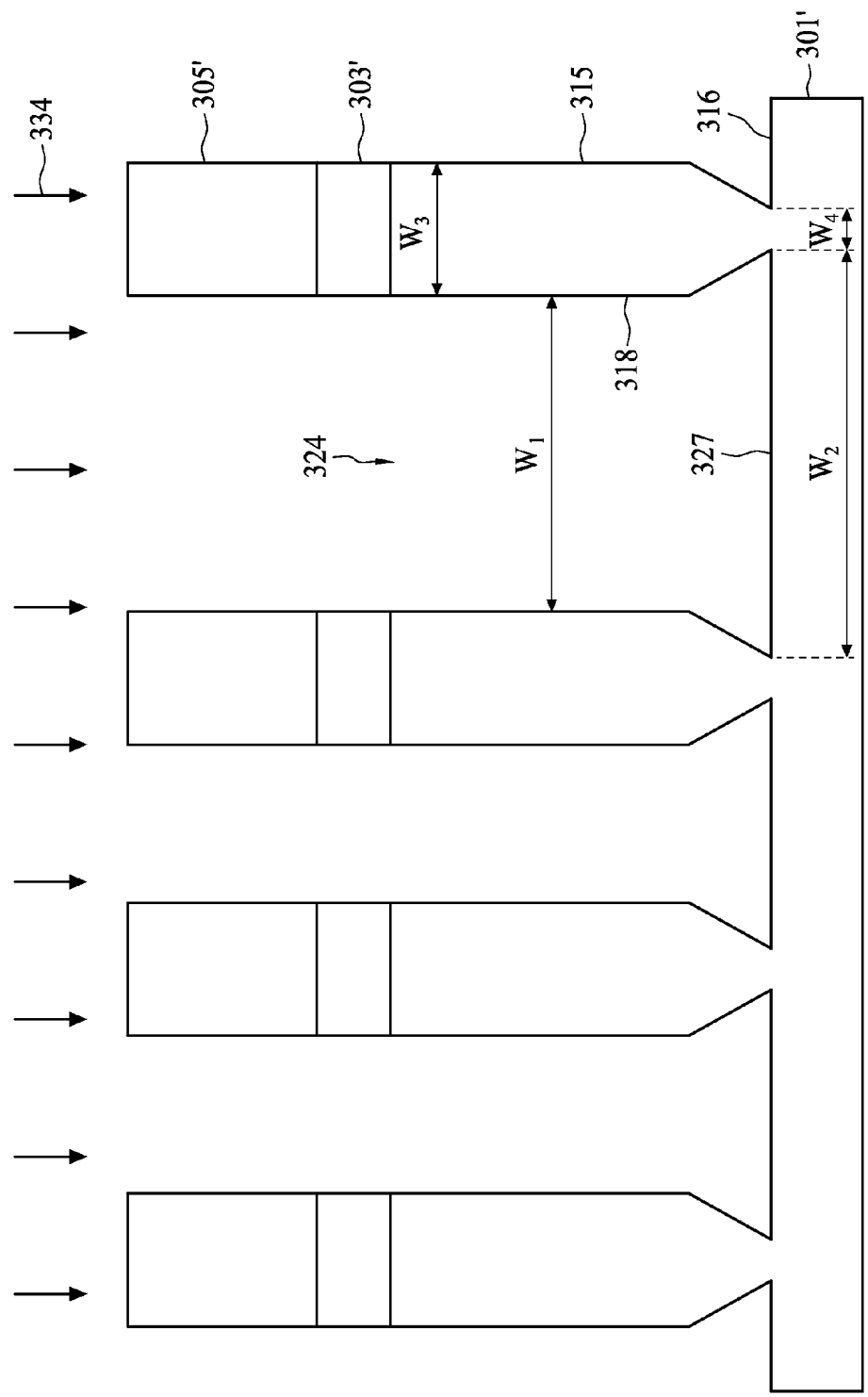

Referring to FIG. 8D, a third etching process 334 is performed therein and shown as arrows indicating ion streams. The third etching process 334 includes chemical molecule, which is ionized and reacts with materials of the semiconductor substrate 301' through the trench 324. Specifically, the third etching process 334 is performed to encroach sidewalls 318 of the fin structure 315 adjacent to a bottom 327 of the trench 324, which refers to a bottom rounding process or a re-entrant process. The trench 324 will not become deeper; instead, the trench 324 becomes greater in width adjacent to the bottom 327. As such, the trench 324 has a constant width W1, except that the bottom 327 has a width W2, wherein the width W1 is smaller than the width W2. The fin structure 315 includes a top width W3 and a bottom width W4 at a horizontal level of the bottom portion 316, wherein the top width W3 is greater than the bottom width W4. By adopting the third etching process 334, residue in the trenches can be removed so as to obtain a predetermined depth. The third etching process 334 utilizes a dry etching process possessed with an isotropic feature, such as a reactive ion etch (RIE). The isotropic feature enables the reactive ions to encroach the semiconductor material laterally. The third etching process 334 includes the chemical molecule, such as $Cl_2$, HBr, $N_2$, $CF_4$, $CHF_3$, $CH_2F_2$, $N_2H_2$, $O_2$, He or Ar. The power of the third etching process 334 ranges from about 100 W to about 1500 W. The patterned photoresist layer 310 is removed before or after the above steps.

Figure 8E:
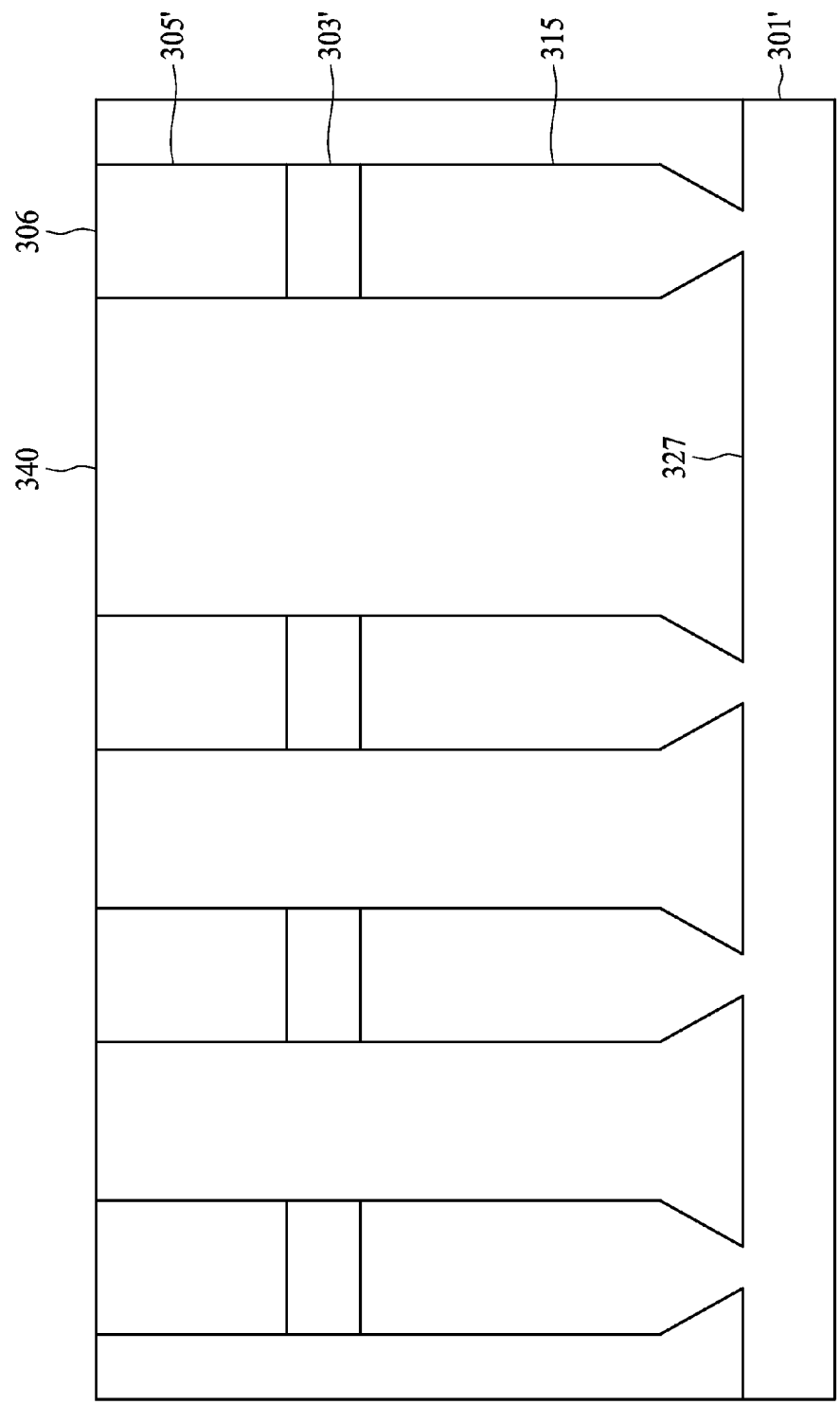

Referring to FIG. 8E, a dielectric layer 340 is filled in the trench 324, wherein the dielectric layer 340 grows from the bottom 327 of the trench 324. The dielectric layer 340 is made of one or more dielectric materials, such as silicon oxide, silicon nitride, silicon oxy-nitride, other suitable dielectric materials, or combinations of materials. Later, a chemical-mechanical polishing (CMP) operation is performed for removing a portion of the dielectric layer 340 above a top surface 306 of the mask layer 305' in order to form a planar top surface.

Figure 8F:
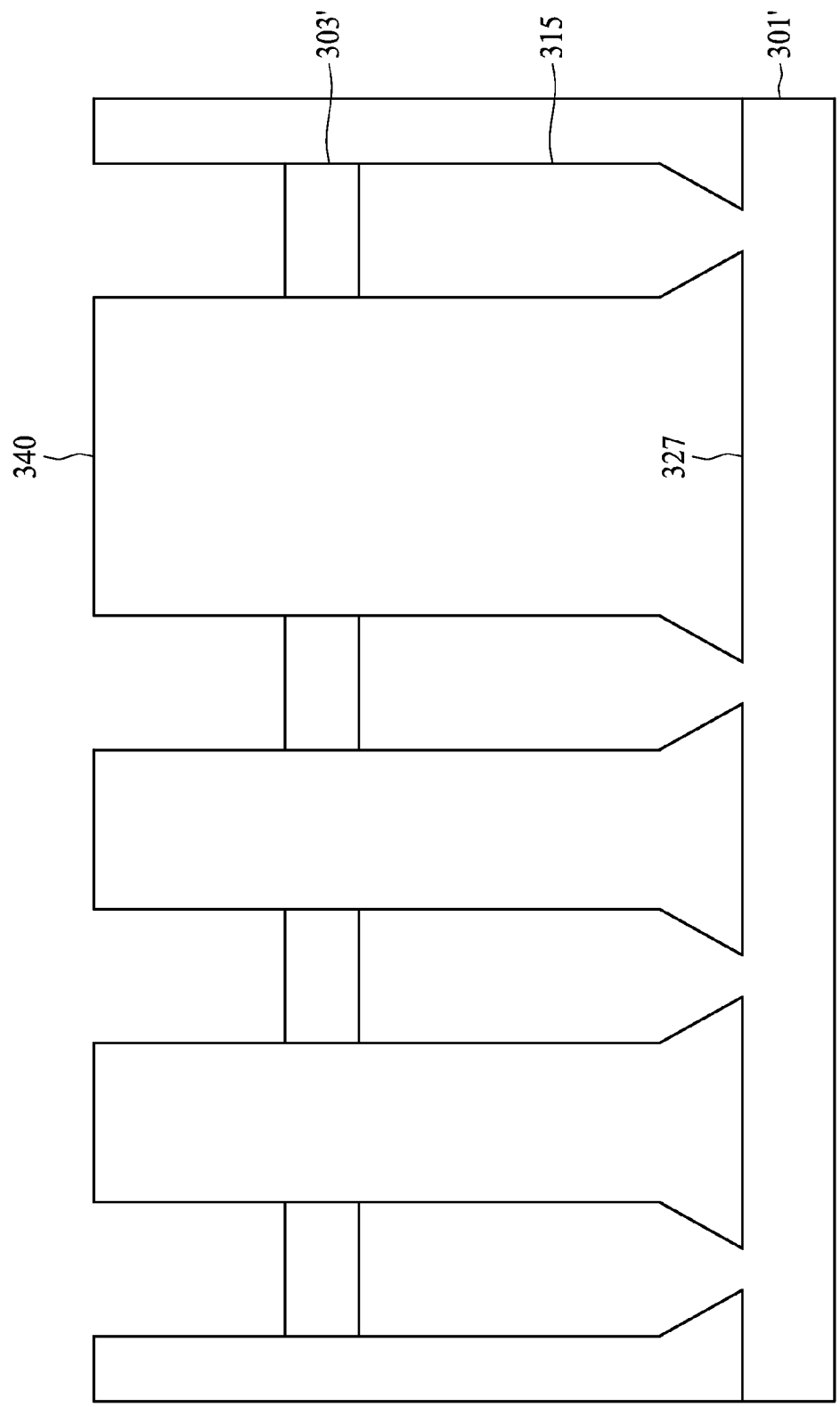

Referring to FIG. 8F, the mask layer 305' is removed by, for example, a wet process using hot $H_3PO_4$ if formed of silicon nitride. In this stage, the dielectric layer 340 is higher than the fin structure 315.

Figure 8G:
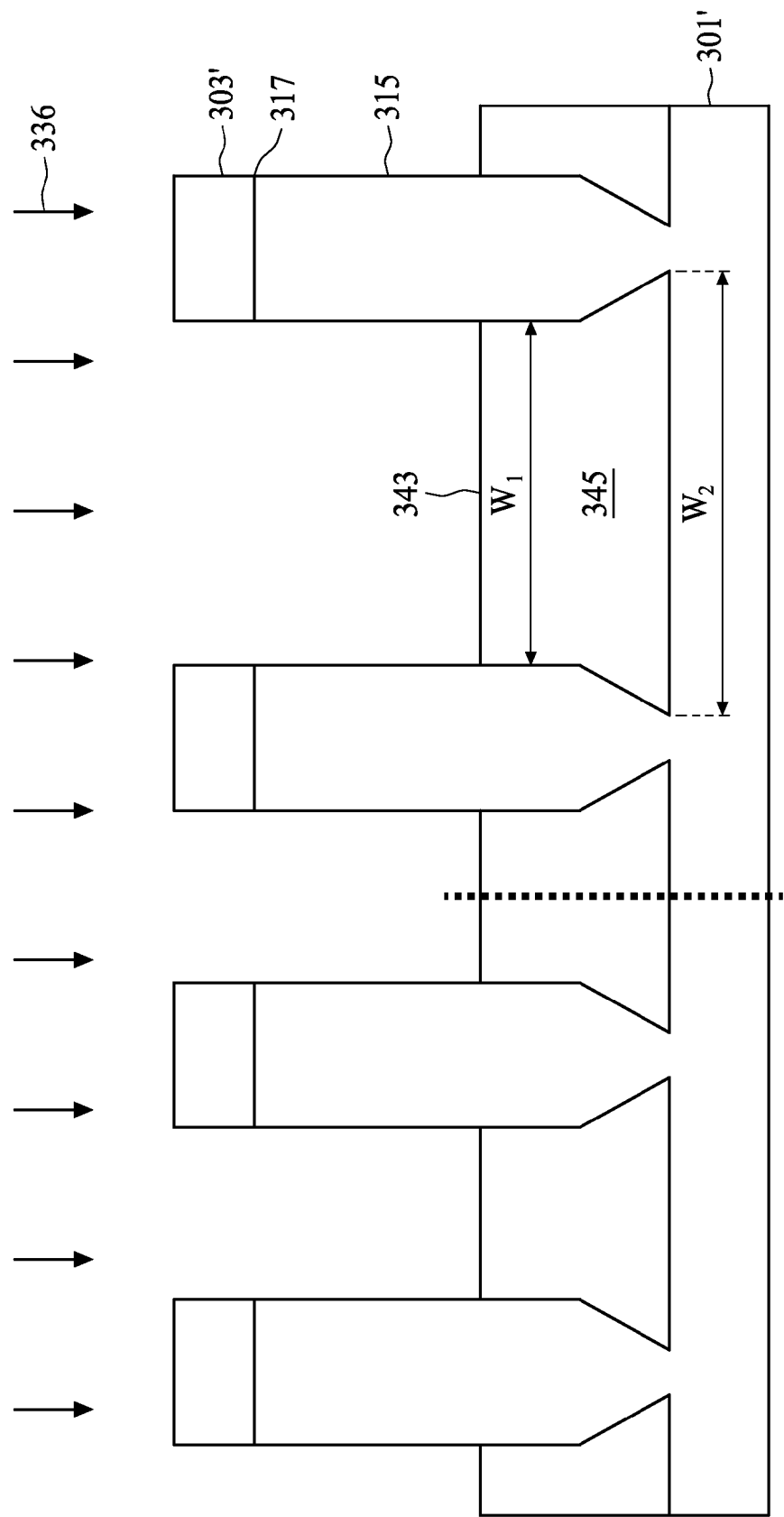

Referring to FIG. 8G, a recess process 336 is performed to lower down the height of the dielectric layer 340. The dielectric layer 340 is removed by, for example, HF acid if formed of silicon oxide or a dry etch. The pad layer 303' serves as a protection layer for the fin structure 315. The dielectric layer 340 is etched and transformed into an STI structure 345. A top surface 343 of the STI structure 345 is lower than a top surface 317 of the fin structure 315. Since the trench 324 has a width W1, the STI structure 345 fits the size of the trench 324 and thus includes the width W1 and the width W2. In this stage, the STI structure 345 defines and isolates the fin structure 315 from other fin structures.

Figure 8H:
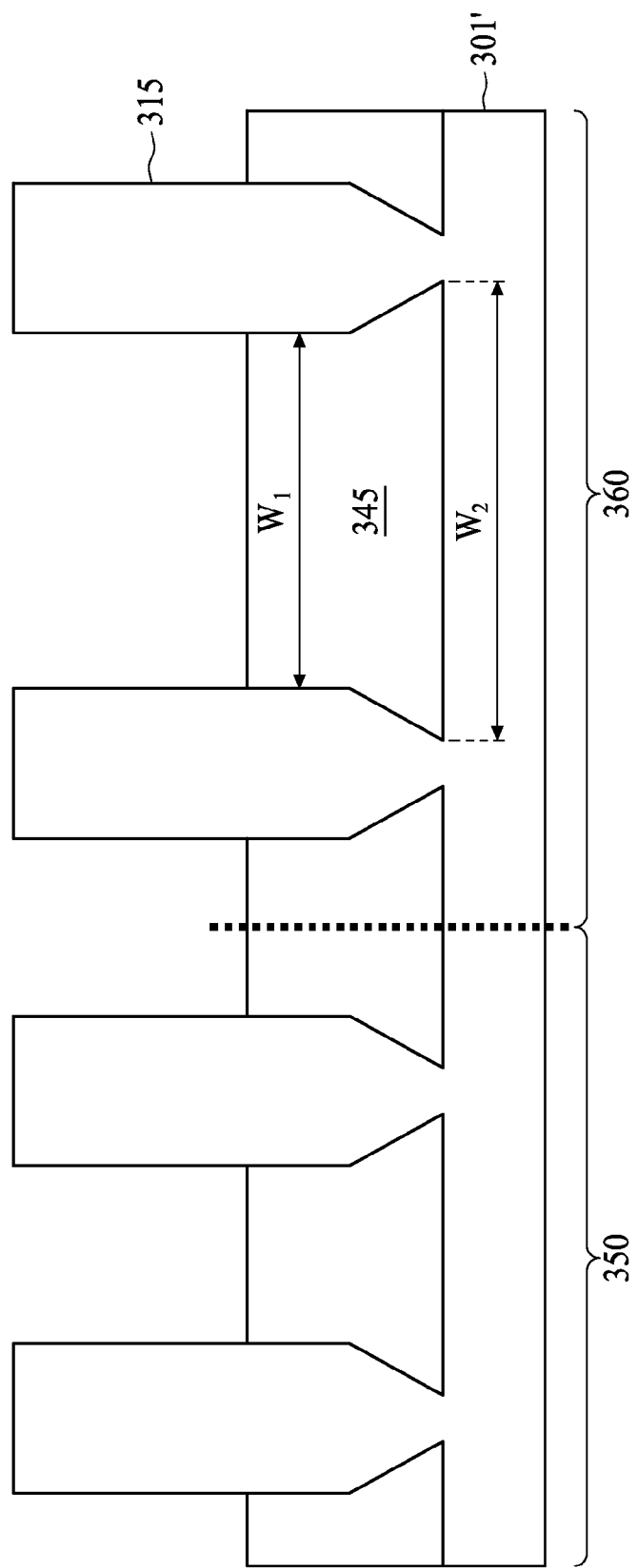

Referring to FIG. 8H, the pad layer 303' is then removed by, for example, HF acid if formed of silicon oxide or a dry etch. The STI structure 345 having the width W2 greater than the width W1 is obtained. Even in a fine pitch region 350 or a coarse pitch region 360, the STI structures have a greater bottom width than a top width, such as the relationship of the widths W1 and W2. As such, since the STI structure 345 will compensate for the well sheet resistance, the well sheet resistance values in the fine pitch region 350 and the coarse pitch region 360 will be equivalent to the target value set at the beginning. The well sheet resistance or electrical properties will not alter and shift in different pitch regions so that current performance of the devices can be improved.

In brief, a bottom width of an STI structure is significant to the well sheet resistance instead of a neck width or the top width of the STI structure. It is noted that the bottom width contributes to a higher sheet resistance for the doping wells. Since the STI structure compensates for the sheet resistance value, the well sheet resistance or electrical properties will not alter and shift in different pitch regions, such as a fine pitch and a coarse pitch region. In addition, by adopting the STI structure, the formation of unwanted residue in smaller trenches can be removed. As such, current performance and yield of the semiconductor devices can be improved.

A semiconductor structure includes a semiconductor substrate and a shallow trench isolation (STI). The STI includes a sidewall interfacing with the semiconductor substrate. The STI extrudes from a bottom portion of the semiconductor substrate, and the STI includes a bottom surface contacting the bottom portion of the semiconductor substrate; a top surface opposite to the bottom surface. The bottom surface includes a width greater than a width of the top surface.

In some embodiments, a width of the STI gradually becomes greater from the top surface to the bottom surface.

In some embodiments, the sidewall of the STI is an inclined surface.

In some embodiments, the sidewall of the STI is a curved surface.

In some embodiments, the sidewall includes a turning point where the STI is divided into an upper portion and a lower portion. The upper portion includes a constant width and a width of the lower portion becomes greater from the turning point to the bottom surface.

In some embodiments, the sidewall of the lower portion is an inclined surface.

In some embodiments, the sidewall of the lower portion is a curved surface.

In some embodiments, the sidewall includes a turning point where the STI is divided into an upper portion and a lower portion. A width at the turning point is greater than the width of the top surface, and the width of the bottom surface is greater than the width at the turning point.

In some embodiments, the sidewall includes a protrusion adjacent to the bottom surface.

In some embodiments, the sidewall includes at least two turning points where the STI includes different widths at each turning point.

In some embodiments, the semiconductor substrate further includes a fin structure interfacing with the sidewall of the STI. The fin structure further includes a top surface including a width, and a bottom width at a horizontal level of the bottom portion of the semiconductor substrate. The top surface is higher than the top surface of the STI. The width of the top surface is greater than the bottom width.

In some embodiments, the semiconductor structure further includes a gate dielectric layer on the top surface and sidewalls of the fin structure; and a gate electrode over the gate dielectric layer.

A semiconductor structure includes a semiconductor substrate, a first shallow trench isolation (STI) and a second shallow trench isolation (STI). The semiconductor substrate includes a first region and a second region, wherein the first region includes a fine pitch of active regions and the second region includes a coarse pitch of active regions. A first STI in the first region includes a sidewall interfacing with the semiconductor substrate, wherein the first STI extrudes from a bottom portion of the semiconductor substrate. The first STI includes a bottom surface contacting the bottom portion of the semiconductor substrate and a top surface opposite to the bottom surface. The bottom surface includes a width greater than a width of the top surface. The second STI in the second region includes a sidewall interfacing with the semiconductor substrate, wherein the second STI extrudes from a bottom portion of the semiconductor substrate. The second STI includes a bottom surface contacting the bottom portion of the semiconductor substrate and a top surface opposite to the bottom surface. The bottom surface includes a width greater than a width of the top surface.

In some embodiments, the sidewall of the first STI includes a turning point where the first STI is divided into an upper portion and a lower portion. The upper portion includes a constant width and a width of the lower portion becomes greater from the turning point to the bottom surface of the first STI.

In some embodiments, the sidewall of the second STI includes a turning point where the second STI is divided into an upper portion and a lower portion. The upper portion includes a constant width and a width of the lower portion becomes greater from the turning point to the bottom surface of the second STI.

In some embodiments, the width of the top surface of the second STI is greater than the width of the top surface of the first STI.

In some embodiments, the bottom surface of the first STI is substantially equal to the horizontal level of the bottom surface of the second STI.

In some embodiments, the semiconductor structure further includes a gate structure on the semiconductor substrate, the first STI and the second STI. The gate structure extends from the first region to the second region.

A method for manufacturing a semiconductor structure includes: forming a pad oxide layer on a semiconductor substrate; forming a mask layer on the pad oxide layer; forming a patterned resist layer on the mask layer, wherein the patterned resist layer includes an opening exposing a portion of the mask layer; performing a first etch to the mask layer and the pad oxide layer through the opening of the patterned resist layer so as to form an opening of the pad oxide layer; performing a second etch to the semiconductor substrate through the opening of the pad oxide layer so as to form a trench; and performing a third etch to the semiconductor substrate through the trench so as to encroach a bottom portion of the trench.

In some embodiments, the method further includes: forming a dielectric layer in the trench; removing the mask layer; and recessing the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate comprising a fin structure; and
a shallow trench isolation (STI) including a sidewall interfacing with the fin structure, the fin structure further comprising:
a top surface including a width, wherein the top surface is higher than the top surface of the STI;
a bottom width at a horizontal level of a bottom portion of the semiconductor substrate;
a first turning point and a second turning point, wherein the width of the top surface is greater than the bottom width, the first turning point meets with a top surface of the STI, and a sidewall of the fin structure is tapered from the first turning point to the second turning point; and
a third turning point between the second turning point and the bottom portion of the semiconductor substrate, the fin structure at the third turning point comprising a width greater than the bottom width.

2. The semiconductor structure of claim 1, wherein the fin structure comprises a minimal width at the second turning point.

3. The semiconductor structure of claim 1, wherein the STI comprises:
a bottom surface contacting the bottom portion of the semiconductor substrate; and
a top surface opposite to the bottom surface,
wherein the bottom surface comprises a width greater than a width of the top surface.

4. The semiconductor structure of claim 3, wherein the STI has a width at the second turning point equal to or greater than the width of the bottom surface of the STI.

5. The semiconductor structure of claim 1, wherein the STI has a width at the third turning point equal to or greater than the width of the top surface of the STI.

6. The semiconductor structure of claim 1, wherein the fin structure comprises different widths at the second turning point and the third turning point.

7. The semiconductor structure of claim 1, wherein the sidewall of the fin structure is tapered from the third turning point to the second turning point.

8. The semiconductor structure of claim 1, wherein the fin structure comprises a constant width between the top surface of the fin structure and the first turning point.

9. The semiconductor structure of claim 1, further comprising a gate structure over the fin structure and the STI.

10. The semiconductor structure of claim 9, wherein the gate structure comprises a gate dielectric layer over the top surfaces of the fin structure and the STI.

11. The semiconductor structure of claim 10, wherein the gate structure further comprises a gate electrode over the gate dielectric layer.

12. The semiconductor structure of claim 1, further comprising a second shallow trench isolation (STI) including a sidewall interfacing with the fin structure, wherein the second STI comprises:
a bottom surface contacting the bottom portion of the semiconductor substrate; and
a top surface opposite to the bottom surface of the second STI,
wherein the bottom surface comprises a width greater than a width of the top surface of the second STI.

13. The semiconductor structure of claim 12, wherein the STI and the second STI are arranged in a fine-pitch region and a coarse-pitch region, respectively, and the pitch in the fine-pitch region is smaller than that of in the coarse-pitch region.

* * * * *